(12) United States Patent
Birk et al.

(10) Patent No.: US 9,229,804 B2
(45) Date of Patent: Jan. 5, 2016

(54) MITIGATING INTER-CELL COUPLING EFFECTS IN NON VOLATILE MEMORY (NVM) CELLS

(75) Inventors: Yitzhak Birk, Hod Hasharon (IL); Amit Berman, Nahariya (IL)

(73) Assignee: TECHNION RESEARCH AND DEVELOPMENT FOUNDATION LTD., Haifa (IL)

( * ) Notice: Subject to any disclaimer, the term of this patent is extended or adjusted under 35 U.S.C. 154(b) by 250 days.

(21) Appl. No.: 13/813,431

(22) PCT Filed: Aug. 16, 2011

(86) PCT No.: PCT/IB2011/053618
§ 371 (c)(1),
(2), (4) Date: May 27, 2013

(87) PCT Pub. No.: WO2012/023102
PCT Pub. Date: Feb. 23, 2012

(65) Prior Publication Data
US 2013/0238959 A1    Sep. 12, 2013

Related U.S. Application Data

(60) Provisional application No. 61/374,281, filed on Aug. 17, 2010.

(51) Int. Cl.
| G06F 11/00 | (2006.01) |
| H03M 13/00 | (2006.01) |
| G06F 11/10 | (2006.01) |
| G11C 7/02 | (2006.01) |
| G11C 7/10 | (2006.01) |
| G11C 16/34 | (2006.01) |

(52) U.S. Cl.
CPC .............. *G06F 11/1068* (2013.01); *G11C 7/02* (2013.01); *G11C 7/1006* (2013.01); *G11C 16/3427* (2013.01); *G11C 16/3418* (2013.01)

(58) Field of Classification Search
CPC . G06F 11/08; G06F 11/0763; G06F 11/1068; G06F 11/1072; G06F 7/02; G06F 7/1006; G06F 16/3418; G06F 16/3427; H04L 1/0042; H04L 1/0061
USPC .......................... 714/746, 710, 708, 723, 811
See application file for complete search history.

(56) References Cited

U.S. PATENT DOCUMENTS

| 6,963,505 | B2 | 11/2005 | Cohen |
| 6,992,932 | B2 | 1/2006 | Cohen |
| 7,409,622 | B1 * | 8/2008 | Lu et al. ........................ 714/755 |
| 2010/0202198 | A1 | 8/2010 | Kim et al. |

FOREIGN PATENT DOCUMENTS

WO    WO/2010/002941    1/2010

\* cited by examiner

*Primary Examiner* — Shelly A Chase
(74) *Attorney, Agent, or Firm* — Reches Patents

(57) ABSTRACT

A system, computer readable medium and a method of operating a non volatile memory (NVM) array that comprises multiple NVM cells, the method comprises: receiving input data to be written to the non volatile memory; performing constraint coding on the input data to provide encoded data; wherein the constraint coding prevents the encoded data from comprising forbidden combinations of values; wherein the forbidden combinations of values are defined based on expected inter-cell coupling induced errors resulting from coupling between NVM cells; and writing the encoded data to the non volatile memory.

41 Claims, 29 Drawing Sheets

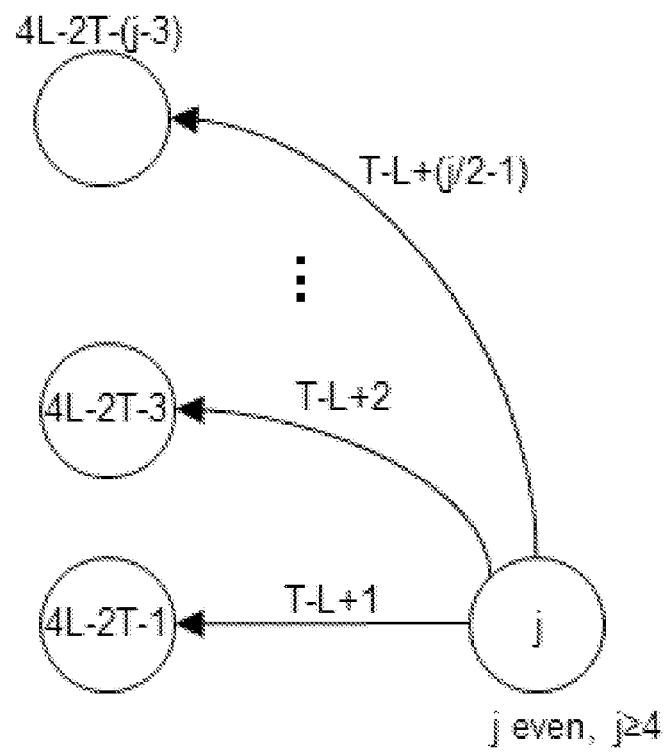
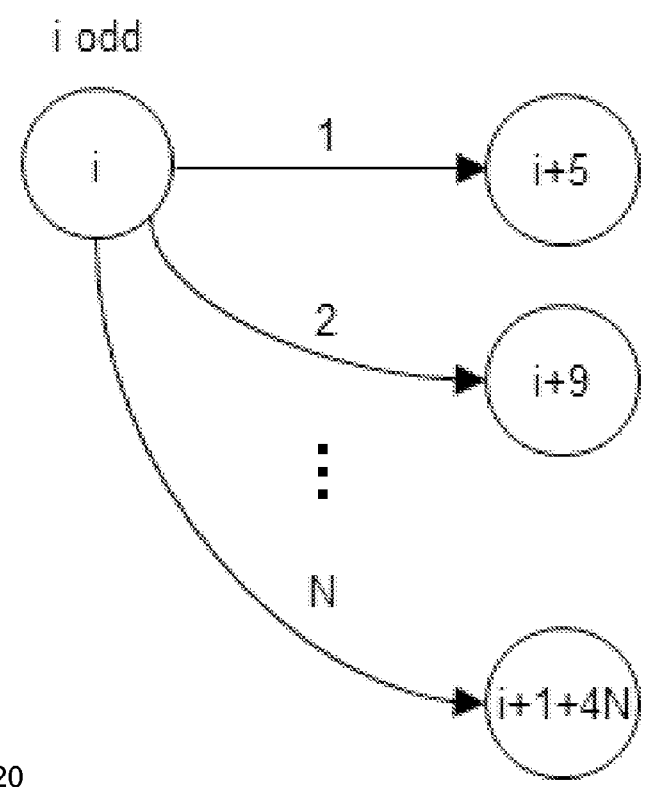
FIG. 6B $$A_G = \begin{pmatrix} T-L+1 & 1 & 1 & 1 & 1 & \cdots & 1 \\ T-L+1 & 0 & 0 & 0 & 0 & \cdots & 0 \\ T-L+2 & 0 & 0 & 0 & 0 & \cdots & 0 \\ T-L+3 & 0 & 0 & 0 & 0 & \cdots & 0 \\ T-L+4 & 0 & 0 & 0 & 0 & \cdots & 0 \\ \vdots & \vdots & \vdots & \vdots & \vdots & \ddots & \vdots \\ L & 0 & 0 & 0 & 0 & \cdots & 0 \end{pmatrix}$$

$$A = \begin{pmatrix} 2 & 1 & 1 \\ 2 & 0 & 0 \\ 3 & 0 & 0 \end{pmatrix}$$

920

1010

1020

1030

1040

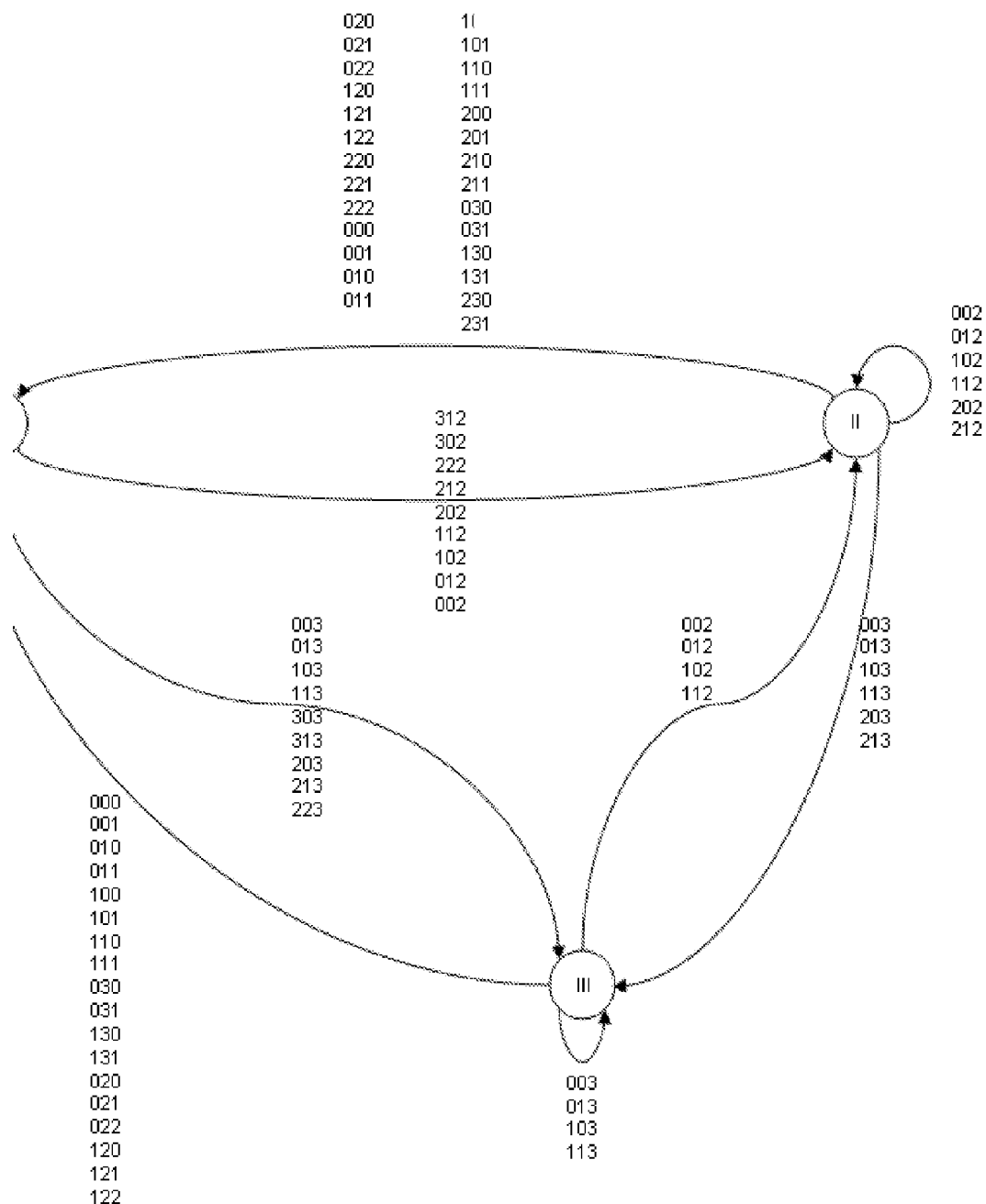
1210 FIG. 12A
$$A^3 = \begin{pmatrix} 28 & 9 & 9 \\ 27 & 6 & 6 \\ 18 & 4 & 4 \end{pmatrix}$$
1220 FIG. 12B

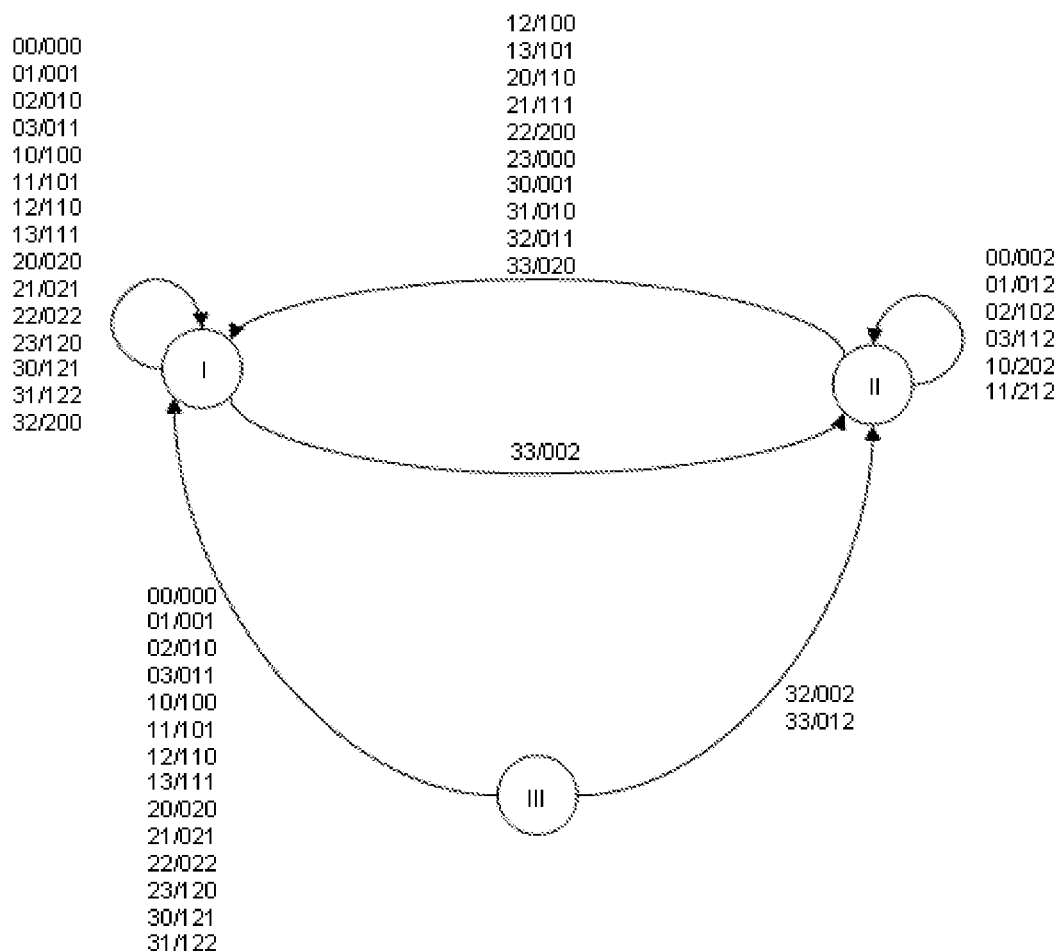
1310  FIG. 13

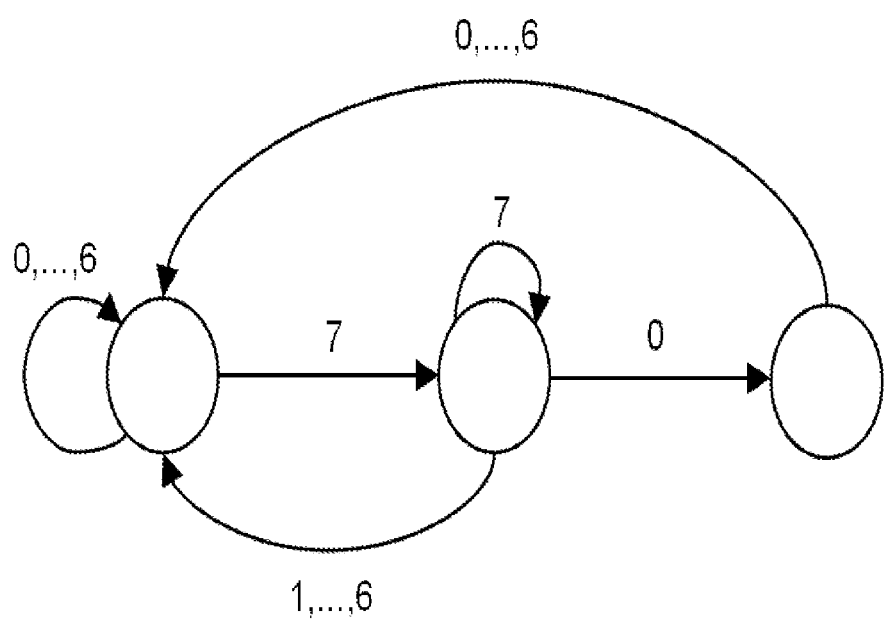
1410   FIG. 14

1510

1710

Defining the codebook such as to exclude at least one forbidden combination of values that is expected to cause an expected read error of a magnitude that is lower than the maximal allowable magnitude. 1922

Detecting a set of legitimate combinations of values that are expected to change their value to a forbidden combination of values due to retention. 1924

Defining at least one legitimate combination of values of the set as a forbidden combination of values. 1925

Defining the codebook such as to exclude forbidden combination of values, based on the allowable value of the parameter and differences between values of values that are expected be stored by adjacent NVM cells. 1926

Defining the codebook such as to exclude forbidden combination of values, based on the allowable value of the parameter, differences between values of values that are expected be stored by adjacent NVM cells and order of programming of the NVM cells. 1927

| aa | ab | ah | bc | bi | cf | dg | dh | di | df | ee | ef | ec | ed | fa | fb | fg |
|---|---|---|---|---|---|---|---|---|---|---|---|---|---|---|---|---|
| 0000/00100 | 0111/00100 | 1110/00010 | 0111/00100 | 1110/00010 | 1000/00011 | 0000/00001 | 1001/01110 | 1100/01110 | 1111/00001 | 0000/00111 | 0111/00111 | 1110/00000 | 1111/00000 | 0000/00000 | 0101/00000 | 1010/00111 |
| 0001/01000 | 1000/01000 | 1111/00100 | 1000/01000 | 1111/00100 | 1001/00111 | 0001/00011 | 1010/10010 | 1101/10010 | | 0001/00001 | 1000/00001 | | | 0001/10000 | 0110/10000 | 1011/00001 |
| 0010/01100 | 1001/01100 | | 1001/01100 | | 1010/01111 | 0010/00111 | 1011/11110 | 1110/11110 | | 0010/11111 | 1001/11111 | | | 0010/11000 | 0111/11000 | 1100/11111 |
| 0011/00000 | 1010/00000 | | 1010/00000 | | 1011/11111 | 0011/01111 | | | | 0011/10011 | 1010/10011 | | | 0011/11100 | 1000/11100 | 1101/10011 |
| 0100/10000 | 1011/10000 | | 1011/10000 | | 1100/11001 | 0100/11111 | | | | 0100/10001 | 1011/10001 | | | 0100/00100 | 1001/00100 | 1110/10001 |
| 0101/11000 | 1100/11000 | | 1100/11000 | | 1101/10001 | 0101/11001 | | | | 0101/11001 | 1100/11001 | | | | | 1111/11001 |
| 0110/11100 | 1101/11100 | | 1101/11100 | | 1110/10011 | 0110/10001 | | | | 0110/00011 | 1101/00011 | | | | | |
| | | | | | 1111/01001 | 0111/10011 | | | | | | | | | | |

| bd | ce | | | | | | | | | | | | | | | |
|---|---|---|---|---|---|---|---|---|---|---|---|---|---|---|---|---|
| 0000/00100 | 0000/00011 | | | | | 1000/01001 | | | | | | | | | | |
| 0001/01000 | 0001/00111 | | | | | | | | | | | | | | | |
| 0010/01100 | 0010/01111 | | | | | | | | | | | | | | | |
| 0011/00000 | 0011/11111 | | | | | | | | | | | | | | | |
| 0100/10000 | 0100/11001 | | | | | | | | | | | | | | | |
| 0101/11000 | 0101/10001 | | | | | | | | | | | | | | | |
| 0110/11100 | 0110/10011 | | | | | | | | | | | | | | | |
| | 0111/01001 | | | | | | | | | | | | | | | |

2201- 2219   FIG. 21B

| gc | gd | gh | gi |
|---|---|---|---|
| 0000/10000 | 0100/10000 | 1000/11110 | 1100/11110 |
| 0001/11000 | 0101/11000 | 1001/00010 | 1101/00010 |
| 0010/11100 | 0110/11100 | 1010/00110 | 1110/00110 |
| 0011/00100 | 0111/00100 | 1011/10010 | 1111/10010 |

| ha | hb | hc | hd |
|---|---|---|---|
| 0000/01000 | 0100/01000 | 1000/01000 | 1100/01000 |
| 0001/00000 | 0101/00000 | 1001/00000 | 1101/00000 |
| 0010/01100 | 0110/01100 | 1010/01100 | 1110/01100 |
| 0011/00100 | 0111/00100 | 1011/00100 | 1111/00100 |

| ie | if | ig | ii |
|---|---|---|---|
| 0000/00001 | 0101/00001 | 1010/00001 | 1111/00010 |
| 0001/00011 | 0110/00011 | 1011/00011 | |
| 0010/00111 | 0111/00111 | 1100/00111 | |
| 0011/01111 | 1000/01111 | 1101/01111 | |
| 0100/01001 | 1001/01001 | 1110/01001 | |

| # | Data | Enc |
|---|------|-----|
| 0 | 00000 | 00000000 |
| 1 | 00001 | 10000000 |
| 2 | 00010 | 11000000 |
| 3 | 00011 | 11100000 |
| 4 | 00100 | 11110000 |
| 5 | 00101 | 11111000 |
| 6 | 00110 | 11111100 |
| 7 | 00111 | 01000000 |
| 8 | 01000 | 01100000 |
| 9 | 01001 | 01110000 |
| 10 | 01010 | 01111000 |
| 11 | 01011 | 01111100 |
| 12 | 01100 | 00100000 |
| 13 | 01101 | 00110000 |
| 14 | 01110 | 00111000 |
| 15 | 01111 | 00111100 |

2310

| # | Data | Enc |
|---|------|-----|
| 16 | 10000 | 00010000 |
| 17 | 10001 | 00011000 |
| 18 | 10010 | 00011100 |
| 19 | 10011 | 00001000 |
| 20 | 10100 | 00001100 |
| 21 | 10101 | 00000100 |
| 22 | 10110 | 10010000 |
| 23 | 10111 | 10011000 |
| 24 | 11000 | 10011100 |
| 25 | 11001 | 10001000 |
| 26 | 11010 | 10001100 |
| 27 | 11011 | 10000100 |
| 28 | 11100 | 01001000 |
| 29 | 11101 | 01001100 |
| 30 | 11110 | 00100000 |
| 31 | 11111 | 00100100 |

$$A_G^8 = \begin{pmatrix} 37 & 49 & 28 \\ 28 & 37 & 21 \\ 21 & 28 & 16 \end{pmatrix}$$

MITIGATING INTER-CELL COUPLING EFFECTS IN NON VOLATILE MEMORY (NVM) CELLS

RELATED APPLICATIONS

This application claims priority from U.S. provisional patent Ser. No. 61/374,281 filing date Aug. 17, 2010 which is incorporated herein by reference.

TECHNICAL FIELD OF THE INVENTION

The invention relates to techniques for operating semiconductor devices and, more particularly, to operating non-volatile memory (NVM), such as floating gate (FG) devices The disclosure may relate to multi-level cell (MLC) Flash technique, data compression technique, increasing Flash memory reliability and/or capacity, constrained coding techniques, error correction techniques, and error correction codes (ECC).

The disclosure may also relate to and be applicable to other forms of solid state memory, such as DRAM (dynamic random-access memory) or SRAM (static random-access memory), as well as to other forms of non-volatile memory such as MRAM (magnetic) and Phase-change memory (PCM).

BACKGROUND OF THE INVENTION

Flash memory is a form of non-volatile memory (NVM) that can be electrically erased and reprogrammed (or written). Flash memory architecture allows multiple memory locations to be erased or written in one programming operation. Two common types of flash memory are NOR and NAND flash. NOR and NAND flash get their names from the structure of the interconnections between memory cells. In NOR flash, cells are connected in parallel to the bitlines, allowing cells to be read and programmed individually. The parallel connection of cells resembles the parallel connection of transistors in a CMOS NOR gate. In NAND flash, cells are connected in series, resembling a NAND gate, and preventing cells from being read and programmed individually: the cells connected in series must be read in series.

NAND Flash memory constitutes a fundamental building block in wide variety of modern electronic systems. Flash memory may comprise a large number of floating gate (FG) memory cells arranged in an array, and connected to a plurality of wordlines (WLs) and bitlines (BLs).

Memory Array Architecture, Generally

Typically, NVM memory cells are arranged in an array comprising many rows and columns, between wordlines extending horizontally (as usually depicted) across the array and bitlines extending vertically (as usually depicted) up and down the array. A memory array typically comprises many millions ("mega"), including billions ("giga") of memory cells.

A memory array typically comprises a plurality of bitlines (BL) extending in parallel with one another vertically through the array (or a portion thereof), and a plurality of wordlines (WL) extending in parallel with one another horizontally through the array (or a portion thereof).

A plurality of memory cells may be connected between the wordlines and bitlines. Some of the memory cells may be connected to the same wordline. Some other of the memory cells may be connected to the same bitline. In a most general sense, the physical address of each cell may be specified by a combination of which wordline (WL#) and which bitline (BL#) a given memory cell is connected to. In other words, any individual one of the memory cells (mc) can be addressed by specifying a wordline and a bitline. Since only one unique memory cell is associated with a given combination of wordline/bitline, the combination of wordline number and bitline number may be considered to be the cell's "native" address.

A memory array may be organized into various logical sections containing pluralities of memory cells, such as blocks, pages and sectors. Some of these sections may be physically isolated and operated independently from one another. Some terminology which may be applied to sections of a memory array (or selected pluralities of memory cells) are:

blocks—may refer to a group of pages. May refer to the minimal number of cells (and, the corresponding number of bits) that can be erased simultaneously, in this case it is called "erase sector". Typical size may be 64 Kbytes.

chunks—may refer to parts of page. Can be also called "hunk". A typical chunk size may be 256 bits.

erase sectors—see "blocks"

pages—page may be the minimal number of bits on flash array that can be programmed simultaneously, or can programmed by a single user operation. The user is required to program data into the flash in chunks of entire pages. Typical page size is 2 Kbytes, 4 Kbytes.

physical sectors—a group of "erase sectors" or "blocks". Typical size may be 256 Kbytes slices—a group of bits on the array with a specific connection configuration to sense amplifiers.

Program Levels

Generally, the more electrons that are stored (or trapped), the higher the threshold voltage (Vt) of the cell may be. Threshold voltage refers to a voltage that is required to be applied to the gate to cause a measurable threshold level of conduction in the channel.

In single level programming (SLC), a small number of electrons may be stored to represent a first program level, such as binary "0", and a larger number of electrons may be stored to represent a second program level such as binary "1". In SLC, only two program levels are available, and one of these may be considered to be the "erase" state.

In multi-level programming (MLC), there may be more than two, such as four program levels ($L_0 \ldots L_n$). A lowest program level (which may be "erase"), may represent binary "11". A next higher program level may represent binary "01". A next higher program level may represent binary "00". And a highest of the four program levels may represent binary "10". (This seemingly miss-ordered sequence of 11, 01, 10, 00 is representative of "Gray Code", which is a binary numeral system where two successive values differ in only one digit.) More than four program levels are possible—for example, 16 program levels (L=0 . . . 15; with L0 typically being an erase state.)

Reliability Issues

When storing electrons at different (such as four different) program levels in many memory cells (or half cells), there are inevitably distributions (or widths) of threshold voltages (Vt) at each of the program levels. This dictates that the levels be established sufficiently far apart from one another so that when reading the contents of the cell, there is good separation (or "margin") between adjacent program levels.

The width of each distribution is dependent on physical phenomena. It may be determined via various experiments on the manufacturing process, observing all possible combinations of program level on various memory cells.

Various factors may affect the quality and reliability of NVM cells. For example, programming one cell may cause injection of electrons into nearby or neighboring cells, affecting (raising or lowering) their Vt. Generally, changes in the Vt of a memory cell, occurring after it has been programmed (or erased), may be referred to as "threshold voltage drift". Threshold voltage drift is well known, and is discussed for example in U.S. Pat. Nos. 6,992,932 and 6,963,505, incorporated by reference herein.

As margins between adjacent program levels shrink, it may become increasingly difficult to accurately read the contents of the memory cell (or half cell). An extreme example would be "overlap", where some of the highest Vt cells of one program level are at the same or higher value than some of the lowest Vt of cells at the next higher program level. "Cells" may refer to floating gate (FG) cells which have one charge storage area each, or may refer to NROM cells which have two distinct charge storage areas.

When reading an NROM cell (a single cell having two distinct charge storage areas), the Vt of the other (second) bit (or half cell) will exert an influence on the measured Vt for the bit being read, and this may be referred to as the "second bit effect".

The "second bit effect" may also refer to situations where a low charge zone (such as "11") is gaining charge when it is near a high charge zone (such as "10"). This definition of second bit effect will be used in the description that follows.

FIG. 1A illustrates a threshold distribution for 2 bit per cell NVM cells assuming (theoretically) that there is no inter-cell coupling and FIG. 1B illustrates the widening of the threshold distributions per program level as a result of the inter-cell coupling. The four lobes (four threshold distributions for four different program levels 11-14 of FIG. 1A are much narrower than those (15-18) of FIG. 1B.

FIG. 1C illustrates nine FG memory cells 20(1)-20(9) connected in a conventional manner to corresponding three wordlines 21(1)-21(3) and three bitlines 22(1)-22(3). A given cell ("C") (or "cell of interest") may be surrounded by adjacent or neighbor cells ("N") in the horizontal direction (on the same wordline) in the vertical direction (on the same bitline) and in the diagonal direction (one wordline and one bitline distant from the given cell ("C"). This figure illustrates neighboring cells that affect inter-cell coupling in NAND Flash. The adjacent neighbor cells (with distance 1) of the cell "C" are marked Nx for x axis, Ny for y axis and Nd for diagonal.

The "problem" and "solution" described herein may be most evident in MLC cells. In multi-level programming (MLC), there may be more than two, such as four, eight, sixteen, or more program levels "L". (The number of levels need not be an integer power of two.) These levels may be referred to simply as L0, L1, L2, L3, etc, with each level representing a nominal threshold voltage higher than the previous one ($Vt_{L0} < Vt_{L1} < Vt_{L2} < Vt_{L3}$, etc). (The lowest level "L0" may actually be an initial "erase" level, but may be considered to be the lowest "program" level for purposes of this discussion.

As NAND Flash memory process technology scales below 32 nm and the number of charge levels per cell exceeds eight, cell threshold voltage distributions may be narrower in order to prevent errors resulting from distribution overlap. An obstacle to achieving narrow threshold voltage distributions in floating-gate (FG) cells is the inter-cell coupling effect. This effect shifts the sensed threshold voltage of a given cell by a degree that depends on (i) the level of coupling between the given cell ("C") and adjacent/neighboring cells ("N") and (ii) on the amount of charge in the surrounding cells. (Particularly, whenever a cell is charged iteratively, whereby in each iteration some charge is added to it followed by a determination of its threshold voltage, and its charging terminated once the target threshold voltage has been reached, only the charge added to the neighboring cells of a given cell subsequent to the termination of its own charging should affect its threshold voltage.) Whenever the charge levels in neighboring cells or the programming order are not known or not considered, this effect may manifest itself as an apparent broadening of the threshold voltage distributions in cells which have been programmed to a nominal program level "L".

FIG. 2 illustrates inter-cell coupling capacitance between floating gates 30(1)-30(9) of a given cell ("C") and its neighboring cells ("Nn"). These cells can be FG cells 20(1)-20(9) of FIG. 1C.

Coupling components shown in the figure are: CFGX, CFGY, CFGXY. The component CFGCG is the capacitance between the centered floating gate to the control gate of the neighbor cell, and it is not shown in the figure. Corresponding voltages of floating gates in neighboring cells are marked V1, V2, V3 V4.

Some traditional designs handle the inter-cell coupling effect in several approaches. Adjusted cell programming algorithms program the cells to intermediate levels and sense the threshold voltage change in order to capture the coupling effect. However, those methods may result in slow programming, and since programming is done in one wordline, the programming methods do not cover the case of inter-wordline coupling and diagonal coupling.

It should be understood that before actually writing user data to an NVM memory device, the data is typically "coded" to accommodate features and characteristics of the device in which it is being stored (or medium through which it is being transmitted) Generally, coding transforms user data from a user format (may be plain data of data which was transformed by other coding system) to another data format in order to get system benefits such as compression (for example, to save power), error protection (when data may be prone to errors) or cryptography (protection of exposing the data). Coding systems are in use with memory as well as regular communication systems. The overall goal of a coding system is handling the data, and should be transparent to the user. Data compression and encryption can be included in a coding system. Coding usually adds redundancy to the data, which may be for error-checking, but it can also or alternatively be a decoding dictionary for compression or cryptography key for compression.

Coding Theory

Generally, a "coding system" is a system or algorithm which transforms user data from a user format (may be plain data of data which was transformed by other coding system) to another data format in order to get system benefits such as compression (for example, to save power), error protection (when data may be prone to errors) or cryptography (protection of exposing the data). Coding system is in use with memory as well as regular communication systems. The overall goal of a coding system is handling the data, and should be transparent to the user. Data compression and encryption can be included in a coding system. Coding usually adds redundancy to the data, which may be for error-checking, but it can also or alternatively be a decoding dictionary for compression or cryptography key for compression.

Generally, "user data" is data provided by any entity using the NVM (or flash chip). From the user's perspective, the NVM is a "black box", the user writes information (data) into it, and expects to get the information back from it.

Coding theory is one of the most important and direct applications of information theory. It is a branch of electrical engineering, digital communication, mathematics, and computer science designing efficient and reliable data transmission methods, so that redundancy in the data can be removed and errors induced by a noisy channel can be corrected. It also deals with the properties of codes, and thus with their fitness for a specific application. There are generally three classes of codes.
1. Source coding (Data compression)
2. Channel coding (Forward error correction)
3. Joint source and channel coding A source code is used to compress words (or phrases or data) by mapping common words into shorter words (e.g. Huffman Code). Source encoding, attempts to compress the data from a source in order to transmit it more efficiently. This practice is common on the Internet where "Zip" data compression is used to reduce the network load and make files smaller.

A channel code contains redundancy to allow more reliable communication in the presence of noise. This redundancy means that only a limited set of signals is allowed: this set is the code. Channel encoding adds extra data bits to make the transmission of data more robust to disturbances present on the transmission channel. The ordinary user may not be aware of many applications using channel coding. A typical music CD uses the Reed-Solomon code to correct for scratches and dust. In this application the transmission channel is the CD itself. Cell phones also use coding techniques to correct for the fading and noise of high frequency radio transmission. Data modems, telephone transmissions, and of course NASA all employ channel coding techniques to get the bits through, for example the turbo code and LDPC codes.

Joint source-channel coding is the encoding of a redundant information source for transmission over a noisy channel, and the corresponding decoding, using a single code instead of the more conventional steps of source coding followed by channel coding. Joint source-channel coding has been proposed and implemented for a variety of situations, including speech and video transmission.

The aim of channel coding theory is to find codes which transmit quickly, contain many valid code words and can correct or at least detect many errors. While not mutually exclusive, performance in these areas is a trade off. So, different codes are optimal for different applications. The needed properties of this code mainly depend on the probability of errors happening during transmission. In a typical CD, the impairment is mainly dust or scratches. Other codes are more appropriate for different applications. Deep space communications are limited by the thermal noise of the receiver which is more of a continuous nature than a bursty nature. Likewise, narrowband modems are limited by the noise present in the telephone network and is also modeled better as a continuous disturbance. Cell phones are subject to rapid fading. The high frequencies used can cause rapid fading of the signal even if the receiver is moved a few inches. Again there are classes of channel codes that are designed to combat fading.

The following terms may be commonly used in description of coding techniques: bit—The word "bit" is a shortening of the words "binary digit." A bit refers to a digit in the binary numeral system (base 2). A given bit is either a binary "1" or "0". For example, the number 1001011 is 7 bits long.
byte—A byte is commonly used as a unit of storage measurement in computers, regardless of the type of data being stored. It is also one of the basic integral data types in many programming languages. A byte is a contiguous sequence of a fixed number of binary bits. In recent years, the use of a byte to mean 8 bits is nearly ubiquitous. The unit is sometimes abbreviated to "B". Terms for large quantities of Bytes can be formed using the standard range of prefixes, for example, kilobyte (KB), megabyte (MB) and gigabyte (GB).
codebook—A codebook is simply the "instructions" on how to encode an input word to a coded word. Starting with a "word", using a codebook, the data sequence for the word will be a "codeword" (or coded word). The codebook also contains the "instructions" on how to decode a coded word back to its original input word. The instructions may be detailed algorithms explaining the conversion or simply a look-up table having two columns: one column for input words (word—a sequence of bits) and second column for coded words where each word on the input words column is to transform to the word in the coded column (in the same row), and vice-versa.
coding—The process of converting information obtained on a subject or unit into coded values (typically numeric) for the purpose of data storage, management, and analysis.
codeword—short for coded word. See codebook.
symbol—The term "symbol" may refer to a group of bits.
word—The term "word" is used on specific communication systems field and may refer to the input word (input sequence of bits) or codeword, both are groups (may be rarely of size 1 bit) of bits.

Constrained Coding

One form of coding is constraint (or constrained) coding. Constraint coding generally prescribes (and implicitly prohibits) certain data patterns to ensure compatibility with a storage medium, such as hard drive or optical disc. If a data pattern does not meet the constraints, it is deemed to be "illegal", and a coding function may be applied to change the pattern, with added redundancy. For storage devices such as hard drive and optical disc, the physics of the storage medium generally demands that constraint coding is used. An example may be prohibiting the writing of four "1s" in a row. As used herein, "modulated coding" means the same thing as "constraint coding". Note that even if the data is "legal", a constraint coding system may add redundancy in order to distinguish between coded data patterns.

The following patents, directed to constrained coding, are incorporated by referenced herein:
U.S. Pat. No. 6,532,565 discloses burst error and additional random bit error correction in a memory.
U.S. Pat. No. 6,188,335 discloses method and apparatus having cascaded decoding for multiple run length-limited channel codes.
U.S. Pat. No. 6,175,317 discloses two-dimensional DC-free encoder and decoder.
U.S. Pat. No. 6,002,718, 1999, and European Patent 771,078 disclose method and apparatus for generating run length-limited coding with DC control.
U.S. Pat. No. 5,719,884 discloses error correction method and apparatus based on two-dimensional code array with reduced redundancy.
See also "An Introduction to Coding for Constrained Systems", Brian H. Marcus, Ron M. Roth, Paul H. Siegel, fifth edition, October 2001, incorporated by reference herein.
Available online at http://www.cs.technion.ac.il/~ronny/constrained.html and also at http://webcourse.cs.technion.ac.il/236520/Spring2010/en/ho.html

SUMMARY

A method of operating a non volatile memory (NVM) array that may include multiple NVM cells, the method may include: receiving input data to be written to the non volatile memory; performing constraint coding on the input data to provide encoded data; wherein the constraint coding prevents the encoded data from comprising forbidden combinations of values; wherein the forbidden combinations of values are defined based on expected inter-cell coupling induced errors resulting from coupling between NVM cells; and writing the encoded data to the non volatile memory.

The performing of the constraint coding may include preventing the encoded data from comprising forbidden combinations of values based on magnitudes of inter-cell coupling induced errors; wherein a certain NVM cell is read to provide an estimate of a threshold voltage of the certain NVM cell; and wherein a magnitude of an inter-cell coupling induced error associated with a certain NVM cell represents a difference between (a) a desired threshold value of the certain NVM cell—assuming a lack of inter-cell coupling and (b) the estimate of the threshold voltage of the certain NVM cell.

The performing of the constraint coding may include preventing the encoded data from may include forbidden combination of values that are expected to cause an expected inter-cell coupling induced error of a magnitude that is above a predefined threshold.

At least one of forbidden combination of values is expected to cause an inter-cell coupling induced error of a magnitude that is below the predefined threshold.

The method may include writing the encoded data to the NVM array while maintaining an uneven gap between at least two pairs of voltage threshold distributions of different program levels.

The a gap between a first pair of voltage distributions of a first pair of program levels may be lower than a gap between a second pair of voltage distributions of a second pair of program levels, wherein the first pair of program levels are lower than the second pair of program levels.

The forbidden combinations of values may correspond to forbidden combination of actual threshold voltages of adjacent NVM cells.

The method may include reading the encoded data from the NVM array to provide read data; and performing a constraint decoding of the read data to provide decoded data.

The method may include detecting forbidden combinations of values in the read data and converting the forbidden combination of values to allowed combination of values.

The converting may be responsive to an expected effect of retention on the encoded data.

A method for providing a codebook of a constraint code, the method may include: receiving an allowable value of a parameter of an inter-cell coupling induced error, the inter-cell coupling induced error results from coupling between non-volatile memory (NVM) cells; and defining the codebook such as to exclude forbidden combination of values, based on the allowable value of the parameter.

The allowable value of the parameter is a maximal allowable magnitude of an inter-cell coupling induced error; wherein a certain NVM cell is read to provide an estimate of a threshold voltage of the certain NVM cell; and wherein a magnitude of an inter-cell coupling induced error associated with a certain NVM cell represents a difference between (a) a desired threshold value of the certain NVM cell—assuming a lack of inter-cell coupling and (b) the estimate of the threshold voltage of the certain NVM cell.

The method may include defining the codebook such as to exclude forbidden combinations of values that are expected to cause an expected inter-cell coupling induced error of a magnitude that exceeds the maximal allowable magnitude.

The method may include defining the codebook such as to exclude at least one forbidden combination of values that is expected to cause an expected inter-cell coupling induced error of a magnitude that is lower than the maximal allowable magnitude.

The method may include defining a desired threshold-voltage range allocation that may include an uneven gap between at least two pairs of voltage threshold distributions of different program levels.

The method may include defining a gap between a first pair of voltage distributions of a first pair of program levels that is lower than a gap between a second pair of voltage distributions of a second pair of program levels, wherein the first pair of program levels is lower than the second pair of program levels.

The forbidden combinations of values may correspond to forbidden combination of actual threshold voltages of adjacent NVM cells.

The method may include defining a desired voltage threshold distribution based on (a) an expected affect of retention on codewords that are stored in the NVM array and (b) forbidden combination of values.

The method may include defining the desired threshold-voltage range allocation among levels such as to increase a probability of (a) a change in a value of a legitimate combination of values stored in the NVM array to a forbidden combination of values, in relation to a probability of (b) a change in value of the legitimate combination of values to another legitimate combination of values.

The method may include detecting a set of legitimate combinations of values that are expected to change their value to a forbidden combination of values due to retention; and defining at least one legitimate combination of values of the set as a forbidden combination of values.

The method may include determining the allowable value of the parameter of the inter-cell coupling induced error.

The determining may be responsive to an order of writing data to the NVM cells.

The order may be selected from a group consisting of left-to-right programming, breadth first programming and open loop programming.

The method may include defining the codebook such as to exclude forbidden combination of values, based on the allowable value of the parameter and differences between values that are expected to be stored by adjacent NVM cells.

The method may include defining the codebook such as to exclude forbidden combination of values, based on the allowable value of the parameter, differences between values that are expected be stored by adjacent NVM cells and order of programming of the NVM cells.

A system, may include: a constraint encoder, arranged to: receive input data to be written to the non volatile memory; and perform constraint coding on the input data to provide encoded data; wherein the constraint coding prevents the encoded data from may include forbidden combinations of values; wherein the forbidden combinations of values are defined based on expected inter-cell coupling induced errors resulting from coupling between non volatile memory (NVM) cells of an NVM array; and a write circuit arranged to write the encoded data to the non volatile memory.

The system may be arranged to prevent the encoded data from may include forbidden combinations of values based on magnitudes of inter-cell coupling induced errors; wherein a certain NVM cell is read to provide an estimate of a threshold voltage of the certain NVM cell; and wherein a magnitude of an inter-cell coupling induced error associated with a certain NVM cell represents a difference between (a) a desired threshold value of the certain NVM cell—assuming a lack of inter-cell coupling and (b) the estimate of the threshold voltage of the certain NVM cell.

The system may be arranged to prevent the encoded data from may include forbidden combination of values that are expected to cause an expected inter-cell coupling induced error of a magnitude that is above a predefined threshold.

At least one of forbidden combination of values may be expected to cause an inter-cell coupling induced error of a magnitude that is below the predefined threshold.

The system may be arranged to write the encoded data to the NVM array while maintaining an uneven gap between at least two pairs of voltage threshold distributions of different program levels.

The gap between a first pair of voltage distributions of a first pair of program levels may be lower than a gap between a second pair of voltage distributions of a second pair of program levels, wherein the first pair of program levels may be lower than the second pair of program levels.

The forbidden combinations of values may correspond to forbidden combination of actual threshold voltages of adjacent NVM cells.

The system may be arranged to read the encoded data from the NVM array to provide read data; and performing a constraint decoding of the read data to provide decoded data.

The system may be arranged to detect forbidden combinations of values in the read data and convert the forbidden combination of values to allowed combination of values.

The system may be arranged to convert in response to an expected effect of retention on the encoded data.

A system, may include: a code generator, arranged to: receive an allowable value of a parameter of an inter-cell coupling induced error, the inter-cell coupling induced error results from coupling between non-volatile memory (NVM) cells; and define the codebook such as to exclude forbidden combination of values, based on the allowable value of the parameter.

The allowable value of the parameter is a maximal allowable magnitude of an inter-cell coupling induced error; wherein a certain NVM cell is read to provide an estimate of a threshold voltage of the certain NVM cell; and wherein a magnitude of an inter-cell coupling induced error associated with a certain NVM cell represents a difference between (a) a desired threshold value of the certain NVM cell—assuming a lack of inter-cell coupling and (b) the estimate of the threshold voltage of the certain NVM cell.

The system may be arranged to define the codebook such as to exclude forbidden combinations of values that are expected to cause an expected inter-cell coupling induced error of a magnitude that exceeds the maximal allowable magnitude.

The system may be arranged to define the codebook such as to exclude at least one forbidden combination of values that is expected to cause an expected inter-cell coupling induced error of a magnitude that is lower than the maximal allowable magnitude.

The system may be arranged to define a desired threshold-voltage range allocation that may include an uneven gap between at least two pairs of voltage threshold distributions of different program levels.

The system may be arranged to define a gap between a first pair of voltage distributions of a first pair of program levels that is lower than a gap between a second pair of voltage distributions of a second pair of program levels, wherein the first pair of program levels is lower than the second pair of program levels.

The forbidden combinations of values correspond to forbidden combination of actual threshold voltages of adjacent NVM cells.

The system may be arranged to define a desired voltage threshold distribution based on (a) an expected affect of retention on codewords that are stored in the NVM array and (b) forbidden combination of values.

The system may be arranged to define the desired threshold-voltage range allocation among levels such as to increase a probability of (a) a change in a value of a legitimate combination of values stored in the NVM array to a forbidden combination of values, in relation to a probability of (b) a change in value of the legitimate combination of values to another legitimate combination of values.

The system may be arranged to detect a set of legitimate combinations of values that are expected to change their value to a forbidden combination of values due to retention; and defining at least one legitimate combination of values of the set as a forbidden combination of values.

The system may be arranged to determine the allowable value of the parameter of the inter-cell coupling induced error.

The system may be arranged to determine in response to an order of writing data to the NVM cells.

The order is selected from a group consisting of left-to-right programming, breadth first programming and open loop programming.

The system may be arranged to define the codebook such as to exclude forbidden combination of values, based on the allowable value of the parameter and differences between values that are expected to be stored by adjacent NVM cells.

The system may be arranged to define the codebook such as to exclude forbidden combination of values, based on the allowable value of the parameter, differences between values that are expected be stored by adjacent NVM cells and order of programming of the NVM cells.

A non transitory computer readable medium that stores instructions for: receiving input data to be written to the non volatile memory; performing constraint coding on the input data to provide encoded data; wherein the constraint coding prevents the encoded data from may include forbidden combinations of values; wherein the forbidden combinations of values are defined based on expected inter-cell coupling induced errors resulting from coupling between non volatile memory (NVM) cells of an NVM array; and writing the encoded data to the non volatile memory.

The performing of the constraint coding may include preventing the encoded data from may include forbidden combinations of values based on magnitudes of inter-cell coupling induced errors; wherein a certain NVM cell is read to provide an estimate of a threshold voltage of the certain NVM cell; and wherein a magnitude of an inter-cell coupling induced error associated with a certain NVM cell represents a difference between (a) a desired threshold value of the certain NVM cell—assuming a lack of inter-cell coupling and (b) the estimate of the threshold voltage of the certain NVM cell.

The performing of the constraint coding may include preventing the encoded data from may include forbidden combination of values that are expected to cause an expected inter-cell coupling induced error of a magnitude that is above a predefined threshold.

At least one of forbidden combination of values is expected to cause a inter-cell coupling induced error of a magnitude that is below the predefined threshold.

The non transitory computer readable medium may store instructions for writing the encoded data to the NVM array while maintaining an uneven gap between at least two pairs of voltage threshold distributions of different program levels.

The a gap between a first pair of voltage distributions of a first pair of program levels is lower than a gap between a second pair of voltage distributions of a second pair of program levels, wherein the first pair of program levels are lower than the second pair of program levels.

The forbidden combinations of values correspond to forbidden combination of actual threshold voltages of adjacent NVM cells.

The non transitory computer readable medium may store instructions for reading the encoded data from the NVM array to provide read data; and performing a constraint decoding of the read data to provide decoded data.

The non transitory computer readable medium may store instructions for detecting forbidden combinations of values in the read data and converting the forbidden combination of values to allowed combination of values.

The converting is responsive to an expected effect of retention on the encoded data.

A non transitory computer readable medium that stored instructions for providing a codebook of a constraint code, wherein the instructions comprise: receiving an allowable value of a parameter of an inter-cell coupling induced error, the inter-cell coupling induced error results from coupling between non-volatile memory (NVM) cells; and defining the codebook such as to exclude forbidden combination of values, based on the allowable value of the parameter.

The allowable value of the parameter is a maximal allowable magnitude of an inter-cell coupling induced error; wherein a certain NVM cell is read to provide an estimate of a threshold voltage of the certain NVM cell; and wherein a magnitude of an inter-cell coupling induced error associated with a certain NVM cell represents a difference between (a) a desired threshold value of the certain NVM cell—assuming a lack of inter-cell coupling and (b) the estimate of the threshold voltage of the certain NVM cell.

The non transitory computer readable medium may store instructions for defining the codebook such as to exclude forbidden combinations of values that are expected to cause an expected inter-cell coupling induced error of a magnitude that exceeds the maximal allowable magnitude.

The non transitory computer readable medium may store instructions for defining the codebook such as to exclude at least one forbidden combination of values that is expected to cause an expected inter-cell coupling induced error of a magnitude that is lower than the maximal allowable magnitude.

The non transitory computer readable medium may store instructions for defining a desired threshold-voltage range allocation that may include an uneven gap between at least two pairs of voltage threshold distributions of different program levels.

The non transitory computer readable medium may store instructions for defining a gap between a first pair of voltage distributions of a first pair of program levels that is lower than a gap between a second pair of voltage distributions of a second pair of program levels, wherein the first pair of program levels is lower than the second pair of program levels.

The forbidden combinations of values correspond to forbidden combination of actual threshold voltages of adjacent NVM cells.

The non transitory computer readable medium may store instructions for defining a desired voltage threshold distribution based on (a) an expected affect of retention on codewords that are stored in the NVM array and (b) forbidden combination of values.

The non transitory computer readable medium may store instructions for defining the desired threshold-voltage range allocation among levels such as to increase a probability of (a) a change in a value of a legitimate combination of values stored in the NVM array to a forbidden combination of values, in relation to a probability of (b) a change in value of the legitimate combination of values to another legitimate combination of values.

The non transitory computer readable medium may store instructions for detecting a set of legitimate combinations of values that are expected to change their value to a forbidden combination of values due to retention; and defining at least one legitimate combination of values of the set as a forbidden combination of values.

The non transitory computer readable medium may store instructions for determining the allowable value of the parameter of the inter-cell coupling induced error.

The determining is responsive to an order of writing data to the NVM cells.

The order is selected from a group consisting of left-to-right programming, breadth first programming and open loop programming.

The non transitory computer readable medium may store instructions for defining the codebook such as to exclude forbidden combination of values, based on the allowable value of the parameter and differences between values that are expected to be stored by adjacent NVM cells.

The non transitory computer readable medium may store instructions for defining the codebook such as to exclude forbidden combination of values, based on the allowable value of the parameter, differences between values that are expected be stored by adjacent NVM cells and order of programming of the NVM cells.

BRIEF DESCRIPTION OF THE DRAWINGS

FIGS. 3, 6A-6C, 7A, 9A, 12A, 13, 14 and 17 are examples of state machines of codes according to various embodiment of the invention;

FIGS. 7B, 9B and 12B are examples of adjacency matrices that represent the graphs of FIGS. 7A, 9A and 12A according to various embodiments of the invention;

FIG. 20 illustrates some stages of the method of FIG. 19 according to an embodiment of the invention;

FIG. 21A-21C represent a state machine of a code according to an embodiment of the invention; and FIG. 22 illustrates a look up table used for encoding, according to an embodiment of the invention.

DETAILED DESCRIPTION OF THE DRAWINGS

Figure 1A:
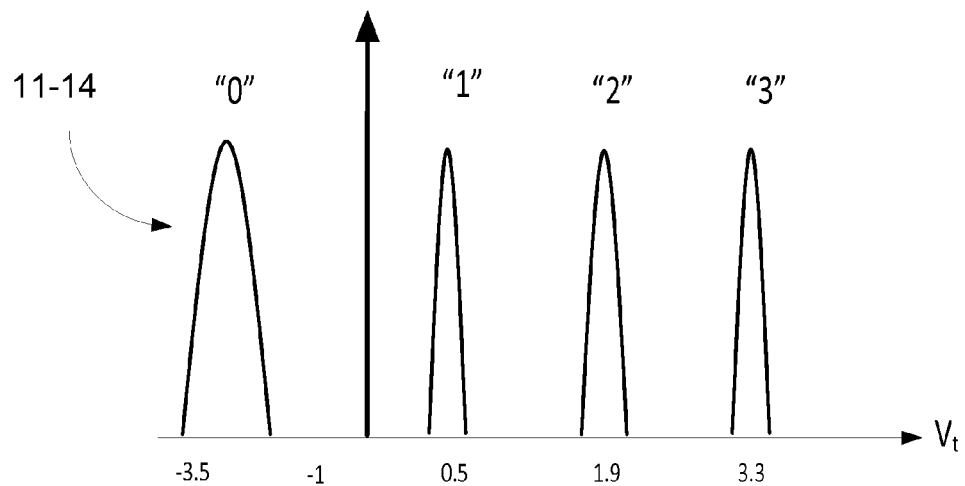
FIG. 1A illustrates a threshold distribution for 2 bit per cell NVM cells assuming (theoretically) that there is no inter-cell coupling.
Figure 1B:
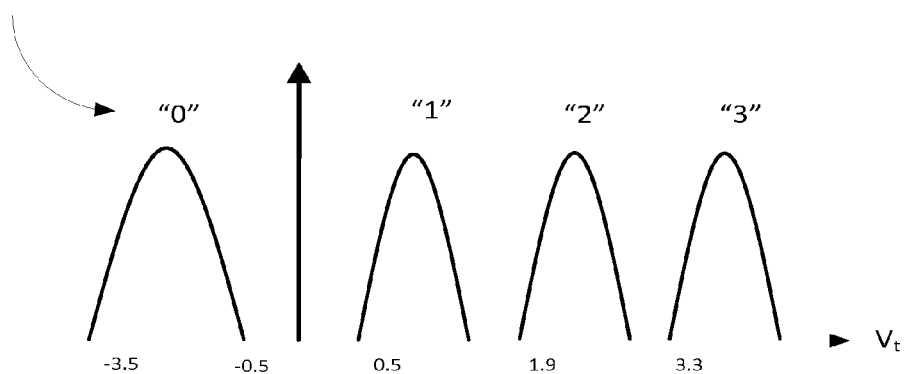
FIG. 1B illustrates the widening of the threshold distributions per program level as a result of the inter-cell coupling.
Figure 1C:
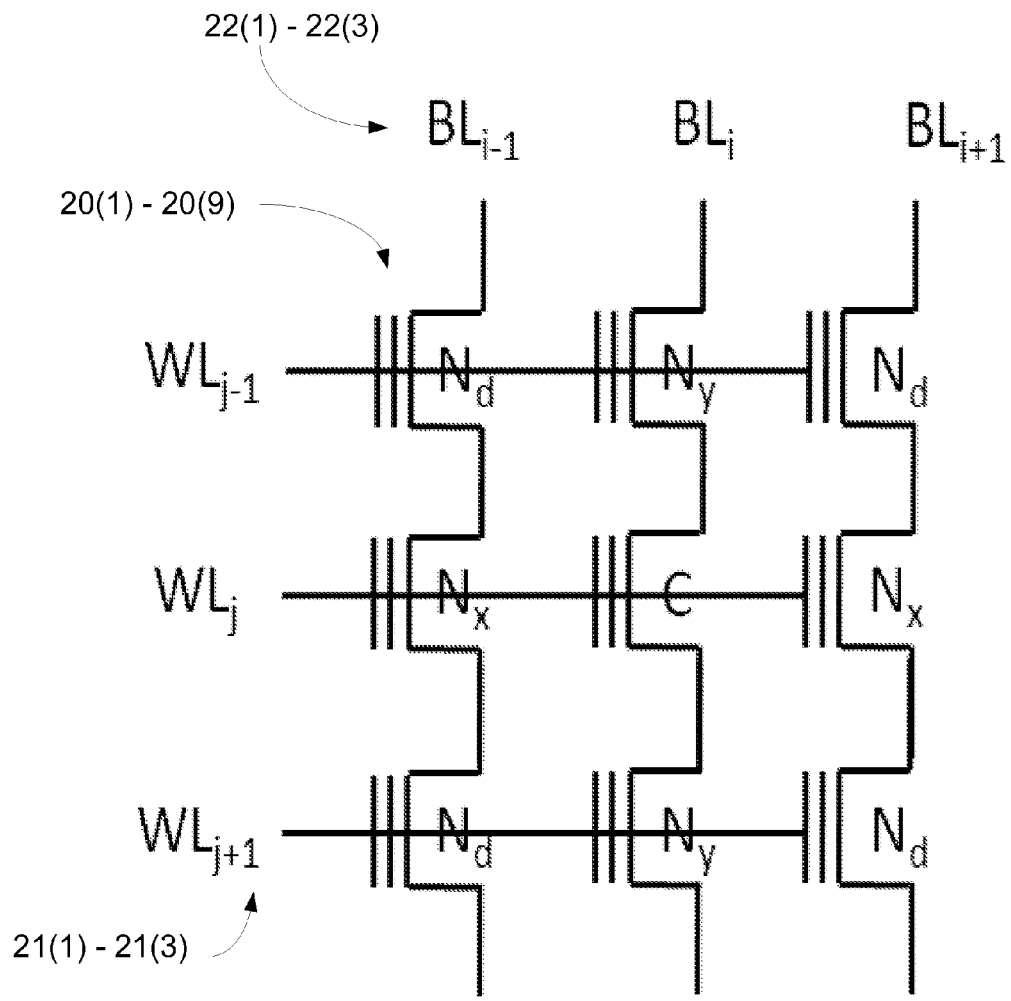
FIG. 1C illustrates nine FG memory cells connected in a conventional manner to corresponding three wordlines and three bitlines.

The disclosure may describe more than one invention, and more than one embodiment of each invention may be described.

Although various features of the disclosure may be described in the context of a single embodiment, the features may also be provided separately or in any suitable combination. Conversely, although the disclosure may be described herein in the context of separate embodiments for clarity, the disclosure may also be implemented in a single embodiment. Furthermore, it should be understood that the disclosure can be carried out or practiced in various ways, and that the disclosure can be implemented in embodiments other than the exemplary ones described herein below. The descriptions, examples, methods and materials presented in the in the description, as well as in the claims, should not be construed as limiting, but rather as illustrative.

Some portions of the description(s) set forth herein may be presented in terms of algorithms and symbolic representations of operations on data bits or binary digital signals within a computer memory. These algorithmic descriptions and representations may be the techniques used by those skilled in the data processing arts to convey the substance of their work to others skilled in the art. An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Unless specifically stated otherwise, as apparent from the following discussions, discussions utilizing terms such as processing, computing, calculating, determining, or the like, may refer to the action or processes of a computer or computing system, or similar electronic computing device, that manipulate or transform data represented as physical, such as electronic, quantities within the registers or memories of the computing system into other data similarly represented as physical quantities within the memories, registers or other such information storage, transmission or display devices of the computing system.

Although any of the inventions disclosed herein may be shown and described with respect to a certain embodiments, certain equivalent alterations and modifications may occur to others skilled in the art upon the reading and understanding of this specification and the annexed drawings. With regard to the various elements or components or process steps that may be disclosed herein, the terms (including any reference to a "means") used to describe such elements or components or process steps may correspond, unless otherwise indicated, to any element or component or process step which performs the specified function of the described elements or components or process steps (for example, that is functionally equivalent), even though not structurally equivalent to the disclosed structure which performs the function in the herein illustrated exemplary embodiments. In addition, while a particular feature of the invention may have been disclosed with respect to only one of several embodiments, such feature may be combined with one or more features of the other embodiments as may be desired and advantageous for any given or particular application.

This disclosure relates generally to a "coding system" for programming "user data" to and reading user data from NVM cells. The coding system may generally include two blocks: an encoder block which is operated only during memory write, and a decoder block which is operated only during memory read.

Generally, unlike other storage media (such as CDROM), there are essentially no physical limitations on the ability to write data into flash memory, wherein it is possible to write any data pattern. However, as described in this disclosure, certain data patterns may be problematic, such as ones that make the threshold voltage distributions wider. Constraint (or constrained) coding (also referred to as "modulation coding") is employed to avoid certain types of data sequences which result in wide distributions. For example, storing a data having a lowest Vt adjacent to data having a highest possible Vt. The "neighboring data" may be in a neighboring FG cell (as described above). ("FG" is generally a FET-type device having a charge storage medium such as a conductive layer—or "floating gate"—for storing charges (electrons and holes) disposed between the device's control gate and channel. The floating gate is not connected to anything, it is "floating". The amount of charge stored in the floating gate affects the threshold voltage Vt of the device.)

The techniques described herein may also be applied to NROM-type cells which have two distinct storage areas (each functioning essentially as an individual memory cell) in a single memory cell. ("NROM" is generally a FET-type device having a charge trapping medium such as a nitride layer for storing charges (electrons and holes) in two discrete areas, near the source and drain diffusions, respectively. Since the charge-trapping medium is not a conductor, charges tend to stay where they are injected.)

According to the invention, generally, constraint (or constrained) coding techniques are applied to data being written to NVM, such as MLC NAND Flash to reduce the inter-cell coupling effect upon disturbing data written in a given cell "C", thereby facilitating making the threshold voltage distributions narrower.

It may be worthy to shorten the read process, the programming process or the erase process and fix errors by an external error correction code. The latency gain of the read process, the programming process or the erase process may be much larger than the latency penalty of the ECC.

The mentioned methods, devices and computer readable medium can maximize the "utilization" of the error correction module. That is, if in the beginning of a product's life, the ECC corrects few errors or less than it is capable, for example because there are few errors in a new device, there are provided methods, devices and computer readable medium that allow a maximization of its capabilities and tune the memory to higher performance at the cost of more data errors (which are guaranteed to be corrected by the ECC).

Constraint coding: A constrained system is defined by a constrained set of "good" or "allowable" cell charge level sequences to be recorded (or transmitted). Constraint (or constrained) coding focuses on the analysis of constrained systems, determination of the set of allowable cell charge-level sequences and/or the design of efficient encoders that transform arbitrary user sequences into effective constrained sequences.

Generally, the technique(s) disclosed herein may be used to increase the storage capacity of an NVM product, such as flash memory, or to reduce, prevent, or recover from bit errors which may occur if the technique(s) were not being used, and may thereby increase the reliability (data integrity) of an NVM product, such as flash memory.

Before proceeding with a description of the "problem" and proposed "solution", certain assumptions, definitions and/or clarifications may be made. (However, these parameters should be considered to be illustrative, rather than limiting.)

1. it is only possible to add charge to cells (or half cells). Charge cannot be removed from cells (or half cells) other than by erasure of an entire block of cells
2. when programming a given cell to a desired program level (Ln) programming typically proceeds in an iterative manner of small programming steps (injection of a small number of electrons) followed by a verify (read the resulting Vt). This may be referred to as "p-v-p-v", meaning program then verify, iteratively, until a desired threshold voltage is substantially achieved.
3. a group (plurality) of cells may be programmed sequentially, for example, a row of n cells may be programmed cell-by-cell, proceeding in a direction from left-to-right, programming one cell to its desired Vt, then proceeding to program a next cell to its Vt, and so forth, and when reaching the (right hand) end of a row, sequentially programming the next row down (starting again at the left hand end of the next row).
4. a group of cells may be programmed incrementally, as follows:
   i. starting at level L0 (the lowest, the least Vt, typically the erase state), simultaneously program all of the cells which need to have their Vt raised to level 1 (L1) or above. The cells which are not programmed in this step will remain (nominally) at L0. (This programming of a subset of cells proceeds essentially simultaneously, and for each cell may be performed in increments, as described above.)
   ii. Next, program only those cells which need to have their Vt raised to level 2 (L2) or above. The cells which are not programmed in this step will remain (nominally) at L0 or L1. (This programming of a subset of cells proceeds essentially simultaneously, and for each cell may be performed in increments, as described above.)
   iii. Next, program only those cells which need to have their Vt raised to level 3 (L3) or above. The cells which are not programmed in this step will remain (nominally) at L0 or L1 or L2. (This programming of a subset of cells proceeds essentially simultaneously, and for each cell may be performed in increments, as described above.)
   iv. And so forth, until the cells at the highest level (Ln) have been programmed to that level Ln.

According to the invention, generally, constraint coding is applied to data being written to NVM so that for a given cell "C", the charge levels of the given cell "C" and its neighbors should adhere to some criterion applied to them jointly.

Whenever one uses iterative programming, the value of Vt of a given cell "C" at the time of completion of its programming is the nominal one to within a permissible tolerance. Accordingly, any effects of the charge already present (at that time) in the cells neighboring "C" have been accounted for. Consequently, the value of Vt of cell "C" is only affected by any subsequent addition of charge to one or more of its neighbors.

According to an aspect of the current invention, the determination of whether a given combination of charge levels in adjacent cells is permissible is based on the values of the level of each cell. In one embodiment of the current invention, the criterion may be based on the sum of the charges added to the neighbors of any given cell "C" after the programming of "C" has been completed.

For example, with the incremental programming scheme, neighboring cells "N" of a given cell "C" having a lower program level do not present a problem, since their effect on the given cell "C", which is programmed after the lower-L neighbor cell, may already have been accommodated for in the iterative (p-v-p-v) process of programming the given cell "C".

In another embodiment, the additional charges may each be weighted by a multiplicative coefficient representing the level of coupling between each cell and the given cell "C".

According to an aspect or feature of an embodiment of the invention, data may be constrained and arranged so as that charge stored in neighbor cells ("N") has limited or no effect on the sensed threshold voltage of the given cell ("C").

According to an embodiment of the invention, constrained coding is employed to limit the effect of floating gate inter-cell coupling. Specifically, we forbid the use of those adjacent-cell charge combinations that result in exceedingly high $V_t$ shift of any cell. Our analysis shows that the required sacrifice of per-level information capacity may be small. In one example, for 7-level cells with at most a 10-level total charge difference between a cell and its neighbors, the code rate is above 0.95. This can be more than offset by the capacity increase brought about by the larger number of levels.

The following tables present an example of the results of the data encoding concept for 16 levels MLC NAND Flash. The levels (L) to which they are programmed are 0 . . . 15 (it being understood that "0" may be an erase state). Each cell is represented by a square, and the level (L) of each cell is shown by a number in the square. Nine memory cells are shown, arranged in three rows and three columns. The center cell is the cell of interest ("C"). The other eight cells are neighboring cells ("N"). These nine memory cells are representative of a (much) larger plurality of memory cells in an array of memory cells.

In this example, the programming order is the one described earlier as incremental, whereby all cells whose target levels are 1 or above are programmed simultaneously and incrementally to level 1; then those whose target level is 2 or higher are similarly programmed to level 2, and so on. Thus, the threshold voltage of a given cell "C" is only affected by charge, if any, that was added to its neighbors after its own programming was completed, as illustrated by the numerical example below.

The following table shows nine cells of uncoded (or "raw", or "user") stored information:

| | | |
|---|---|---|
| 8 | 14 | 2 |
| 3 | 9 | 13 |
| 11 | 15 | 6 |

The sum of positive differences (i.e., the sum of differences between the centered reference cell ("C") and its neighbors, where the subtraction between neighbor cell and reference cell charge levels is a positive number) yields (14−9)+(13−9)+(15−9)+0=15.

The following table shows the same nine cells, but with a different set of levels for the neighboring cells.

| 8  | 10 | 2  |
|----|----|----|
| 8  | 9  | 12 |
| 11 | 11 | 9  |

Here, the sum of positive differences is (10−9)+(12−9)+(11−9)+0=6. It is thus readily evident that some cell-level combinations result in less influence on cell "C" than do others. One example of a constraint is limiting the sum of positive difference to be less than 15. With this constraint, the first aforementioned combination of levels would be excluded whereas the second one would be permitted.

Notice in this example that the values (levels) for neighboring cells on the same row (bitline) as the cell of interest may be changed, the values (levels) for neighboring cells in the same column (wordline) as the cell of interest may be changed, and the values (levels) for neighboring cells which are "diagonal" to the cell of interest may be changed.

For each of these possibilities (constraining the values of neighbor cells on the same row, same column, or diagonal), some neighbor cells may be given greater weight than others, using any weighting algorithm, and the effects of cells which are more than one cell away from the cell of interest can also be factored into the constraint algorithm.

Of course, constraining the data means that fewer than all of the possible data (cell-level) combinations may be written. However, by increasing reliability and enabling more data levels to be written (through narrower distributions), an overall increase in storage capacity may be achieved.

The choice of the numerical value of the constraint, e.g. the value of the maximum permissible value of the sum of positive differences (15 in the above example) represents a trade-off: relaxing the constraint (a higher value in the example) allows a larger fraction of the possible combinations, but reduces the possible number of distinct charge levels. Using L to denote the number of levels and R to denote the fraction of combinations that are permissible, the effective storage capacity of a sequence of N cells is $R \times L^N$.

In an embodiment of the invention, the threshold value may be selected so as to maximize capacity according to the foregoing expression. The actual number may depend on the various parameters such as intra- and inter-cell capacitances.

Some Examples of Mitigating Inter-Cell Coupling

In a constrained coding system, in an example of having 4 program levels, a digital input sequence in which the sum of positive charge level differences between a given flash cell (C) and its neighbors to the left (NL) and to the right (NR) is limited to be no more than a threshold value, such as 5.

In other words, if the data would result in a sum of positive differences being more than 5, the data is treated as a problematic sequence, and is transformed into a non-problematic sequence before writing (programming).

For example, the following encoder/decoder constraint may be implemented for $$D(C) = \text{Max}\{Nl-C, 0\} + \text{Max}(Nr-C, 0) \leq 5$$

A simple coding scheme may be implemented according to the following look-up table or digital combinations being produced from a state machine, and handles the case of programming a group of cells at-once with p-v-p-v.

Consider an example of code rate=2/3, from which the following lookup table can be built.

| Input user data | Output coded data |
|----|----|
| 00 | 031 |
| 01 | 131 |
| 02 | 331 |
| 03 | 321 |
| 10 | 301 |
| 11 | 300 |
| 12 | 310 |
| 13 | 311 |
| 20 | 021 |
| 21 | 121 |
| 22 | 210 |
| 23 | 211 |
| 30 | 221 |
| 31 | 231 |
| 32 | 200 |
| 33 | 201 |

The encoding scheme (mapping) can be performed using a pre-compiled lookup table, or by a state-machine, or by other means such as a processor. The mapping can be expressed as a function, lookup table or as an algorithm.

The constraints can be 1-dimensional, in wordline direction or in a bitline direction. The constraints can also be 2-dimensional, 3-dimensional, involving involve "diagonal" neighbors as well as non-immediate neighbors (e.g., a neighbor's neighbor).

It may be noted that when using 2-D constraint encoding and decoding with respect to surrounding of the target cells, the relevant neighbor cells in the bitline/wordline/diagonal directions may have to be read before doing encoding or decoding operations. For example, when doing row-by-row coding, the previous row (wordline) would be read in order to encode and decode.

The encoding function may be one-to-one or one-to-multiple, i.e., one may optionally encode the same information in more than one way. However, the encoding should be unambiguous; i.e., a given cell-level combination should correspond to a single information value.

The neighboring cells can be any collection (or group) of cells in the flash memory array, for example, a distance 4 in the wordline direction and a distance 5 in the bitline direction, etc.

The constraint on the input user data can be any function, for example, average of cells, maximum value, minimum value, sum of differences, only differences, etc.

Figure 3:
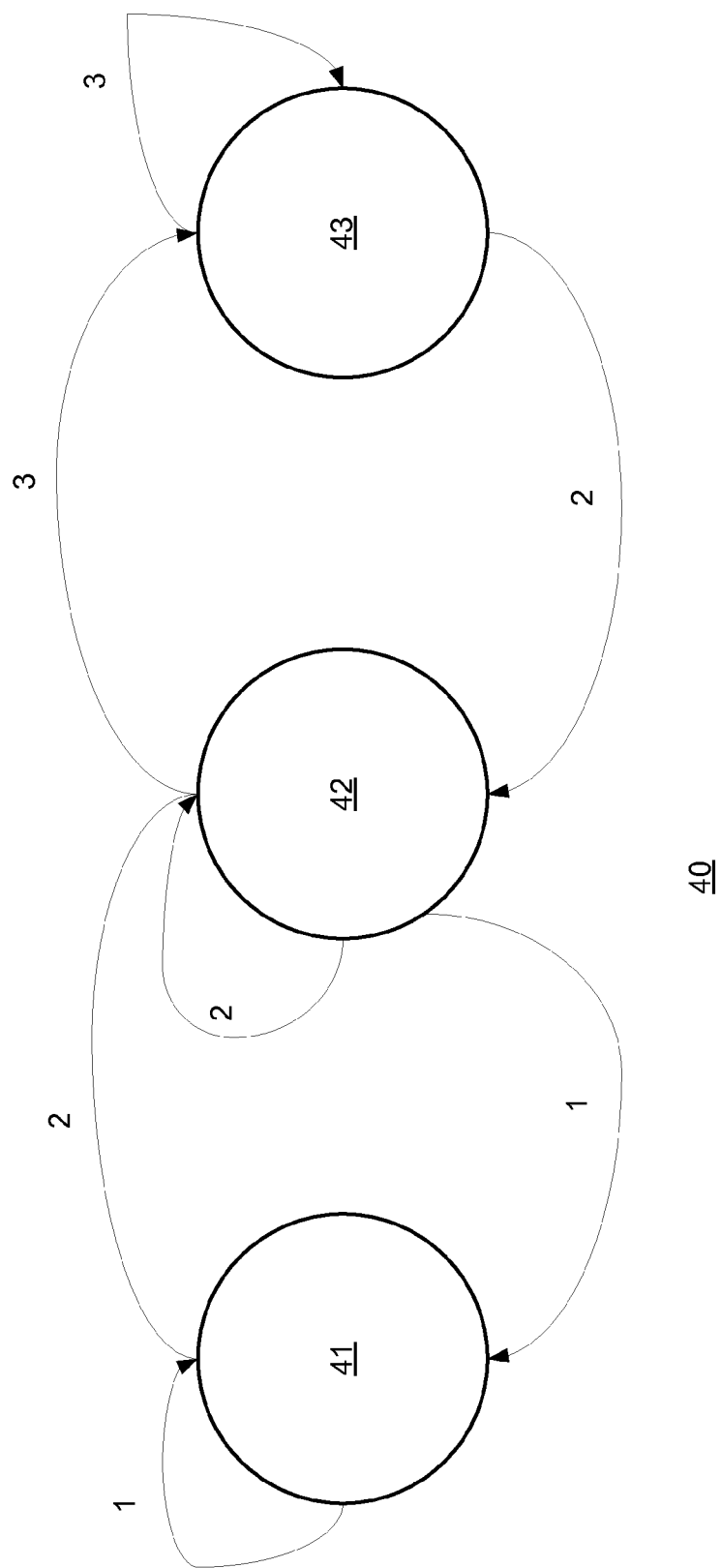

FIG. 3 is an example of a state machine description of the legal input sequences for 3-Level MLC flash with constraints of +/−1 charge level differences between adjacent cells, according to an embodiment of the invention. A different constraint may be that no sequence has more than a 2 charge level difference between neighboring cells, and may be described by the following equation, where N is the neighbour cell of C in the same wordline with distance 1 (adjacent cell) $D(C) = |N-C| \leq 2$.

The state machine has three states 41, 42 and 43 and multiple edges, each edge illustrates a legal value of a bit. A legal codeword can be obtained by passing through the states of a state machine. (Any legal codeword corresponds to a permissible sequence of states.)

An exemplary Constrained Encoding System

Figure 4A:
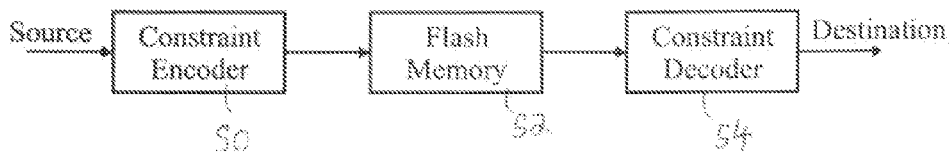
FIG. 4A illustrates a constrained encoding system (or modulation encoding system) according to an embodiment of the invention.

FIG. 4A illustrates, generally, a constrained encoding system (or modulation encoding system) implementing the techniques described herein may comprise encoder and decoder blocks. Generally, during "write" (when programming the memory cells), the constrained encoder transforms problematic data sequences into non-problematic sequences which are then written to flash memory; during "read", the constrained sequences are transformed back to the original (problematic) ones.

The constrained coding encoder 50 may not allow (in other words, will restrict) a specific defined sequence to be written to the flash memory 52 and will convert it to an allowed sequence.

The constrained coding decoder 54 may decode the original pattern from the data read form the flash memory array, and may be combined with an error correction code (ECC) or algorithm.

It may be understood that although for meaningful system operation both encoding and decoding may be needed, in some cases (such as a memory reader) only one may be present.

Figure 4B:
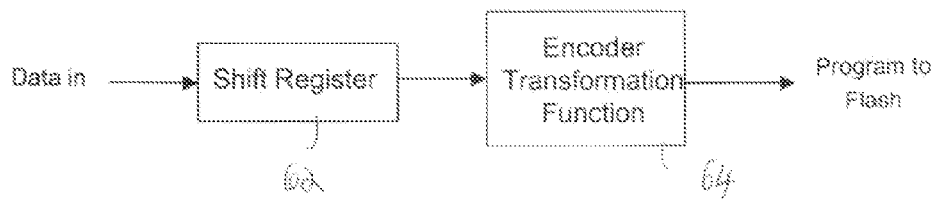
FIG. 4B illustrates, generally, an embodiment of an encoder.

FIG. 4B illustrates, generally, an embodiment of an encoder. In includes a shift register 62 that receives the input date. The shift register 62 is followed by an encoder transformation function 64 that performs the constraint encoding to output encoded data to be written to the flash memory 50.

Figure 4C:
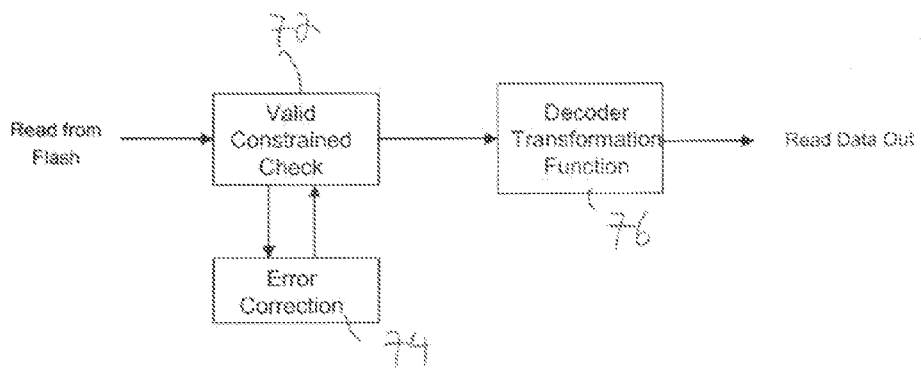
FIG. 4C illustrates, generally, an embodiment of a decoder.

FIG. 4C illustrates, generally, an embodiment of a decoder. It includes a valid constraint check unit 72 that receives read data from the flash memory 52 and may send forbidden bit combinations to an error correction module 74. The error corrected combination of values are sent via the valid constraint check unit 72 to a decoder transformation function 76 that performs constraint decoding to output decoded data.

An Example of Data Flow

Figure 5A:
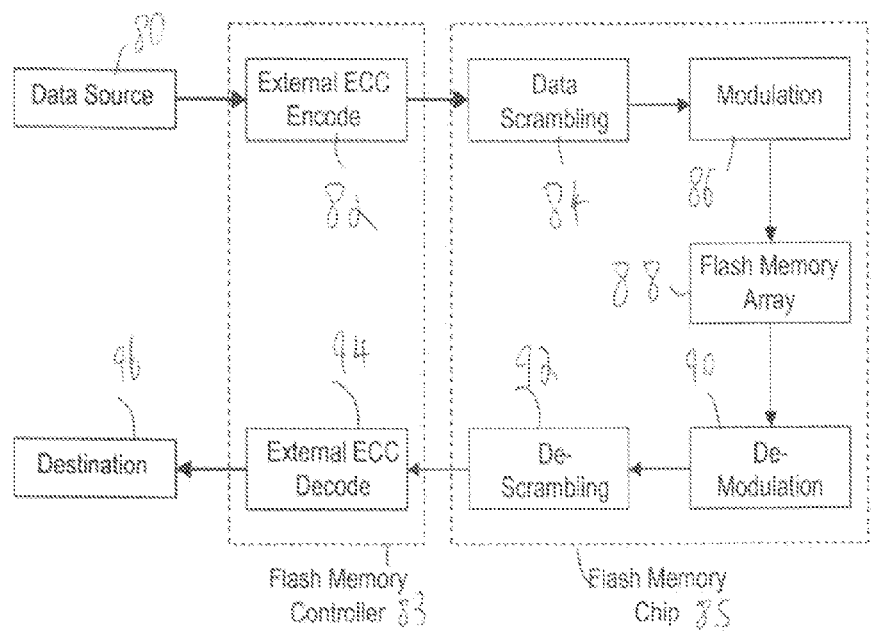
FIG. 5A illustrates an example of Flash Memory data flow of the prior art.

FIG. 5A illustrates an example of a system that include a Flash Memory chip of the prior art.

Data source 80 provides data to an external error correction code (ECC) encoder 82 of a flash memory controller 83. The ECC encoder 82 performs error correction coding and provides error-protected data to a data scrambler 84 of a flash memory chip 85. Scrambled data from data scrambler 84 is sent to modulator 86. Modulated data is send from modulator 86 to the flash memory array 88. De-modulator 90 can fetch data from the flash memory array and de-modulate it. The de-modulated data is sent to de-scrambler 92 of the flash memory chip 85. De-scrambled data from the de-scrambler 92 is sent to an external ECC decoder 94 of the flash memory controller 83. The ECC decoded (and corrected if need be) data is sent to a destination 96.

Figure 5B:
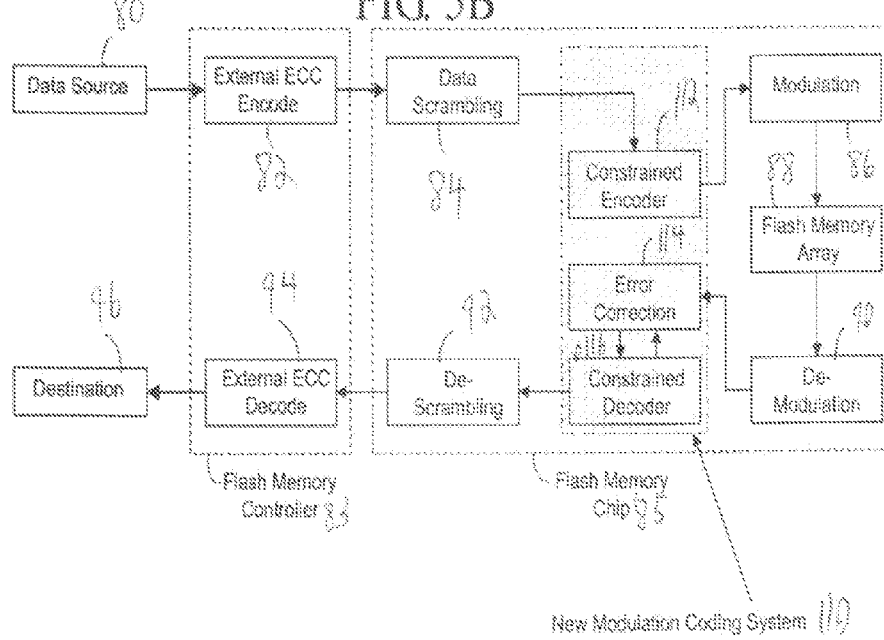
FIG. 5B illustrates an example of Flash Memory data flow according to an embodiment of the invention.

FIG. 5B illustrates an example of a system that includes a Flash Memory chip according to an embodiment of the invention.

The system of FIG. 5B differs from the system of FIG. 5A by including a constraint encoder 112, a constraint decoder 116 and an error correction unit 114. The constraint encoder 112 can be connected between the data scrambling unit 84 and the modulation unit 86 or can be located elsewhere at the write path that ends in the flash memory array 88. The error correction unit 114 and the constraint decoder 116 can be connected between the de-modulator 90 and the de-scrambler 92 or anywhere at the read path that starts with the flash memory array 88.

Dimensions of the Design Space

Regarding which cells are treated as "neighboring cells", the dimensions of the "neighborhood" may be along a word line, a bit line, along the diagonal, and any combination of those. The distance of the neighborhood is not limited to cells which are immediately adjacent the given cell, but may include a neighbor's neighbor, etc.

Although the sum of differences between a given cell (C) and its neighbors has been described, it should be understood that other difference functions may be employed (and included under the definition of "sum")—for example, the sum (or average) of levels of all neighboring cells, a weighted sum (or average) (e.g., cells on right or left have more weight than up or down, and diagonal is even less) a function based on the level difference between the neighbors and the cell.

The actual function would normally correspond to the programming order. For example, if programming proceeds from left to right (and neighbors are only right and left) then, given that the value is verified at end of a cell's programming, a given cell would only be affected by the level of the cell to its right, as this is the only neighbor that is programmed after the given cell.

Encoding and decoding mechanisms may be implemented as a lookup table, a function, or an algorithm. (Function and algorithm can be executed using combinational hardware, a finite state machine or a processor/controller).

Note that all the above are orthogonal, except for a dependence of the constraining threshold function on the relevant neighborhood and programming order.

Some important combinations for which the techniques of the present disclosure are applicable may include, but are not limited to Left-to-right programming, left & right neighbors, Vt verification during programming 1. The threshold may be determined solely based on the (absolute) level (i.e., not difference) of at least one cell to the right of cell under consideration. For instance, considering cell i, the level of cell (i+1) should not exceed L. (This is actually a simple restriction on the maximum level of all cells.) (this was referred to above as "sequential" programming)

2. Regarding the term "sequence", it should be understood that this does not refer to a temporal sequence. Rather, it is a spatial sequence, namely a sequence of information symbols that are to be encoded and programmed into a sequence of neighboring cells. Note also that there is not generally a 1-1 mapping between information symbol in the information symbol sequence and memory cell, as this depends on the number of levels in the cell. Moreover, with the constrained encoding the number of usable levels in a given cells depends on the level used in neighboring cells. Therefore, the preferred terminology may be a chunk of information (which can be described as a value of that information (just like a sequence of bits can be viewed as a number) and an enumerated set of level combinations in the chunk of neighboring cells jointly used for storing the information value.

"Breadth first" programming, left & right neighbors, VT verification during programming (this was referred to above as "incremental and iterative" programming). Here, the first step may be to program all cells except for those that need level 0 to level 1. This is done concurrently with verification. Next, those cells that should be at level 2 or above are programmed concurrently, with verification, and so on.

Thus, cell i may only be affected (in a manner that was not taken care of through the verification during its own programming) by cells (i−1) and (i+1). Moreover, it may only be affected by one or both of those if they were programmed to levels higher than i's. Finally, this effect may only be determined by the extent to which their levels are higher than that of cell i.

Any of the above, "open loop" programming (no Vt verification). Here, in the simplest case, the threshold is determined by the (possibly weighted) sum of the levels of all the neighbors, because there is an underlying assumption when determining how much charge to inject into cell i whereby the other cells are at level 0. Instead, one can assume level L baseline in the neighbors and plan the charge injection accordingly. Now, the threshold will be based on the (possibly weighted) sum of the (signed) difference between the level of each neighbor and the assumed baseline level.

Other approaches have been employed to mitigate the effect of inter-cell coupling on the shape of the Vt distributions (widening) and to thus increase the number of permissible charge levels.

U.S. Pat. No. 6,996,004 ("Fastow et al"), entitled "Minimization of FG-FG Coupling in Flash Memory", discloses a programming order that purports to essentially achieve a full accommodation of the inter-cell coupling. The idea presented therein is to program all cells simultaneously and incrementally, with individual testing of the value of Vt in every cell at each step. The increments are adjusted such that the programming of all cells is completed almost simultaneously. Since a cell's Vt is only affected by charge added to its neighbors after its own programming has been completed, sufficiently small increments result in an ability to attain the desired Vt values for all cells. With this, narrow Vt distributions may be achieved, a large number of levels may be permitted, yet no sacrifice is made in the form of "forbidden" combinations.

The scheme of Fastow et al may appear, in some regards, to be superior to the techniques presented herein. However, the benefits attributable to Fastow et al come at the cost of complex, slow programming. Also, whenever the effect of the charges stored in the neighbors of a given cell "C" change its Vt by more levels than its originally intended level, cell "C" must not be charged and yet will end at a higher level than the intended one. Also, whenever, as is often the case, programming is done one wordline at a time, the method of Fastow et al does not cover the effects of inter-wordline coupling and diagonal coupling.

In another embodiment of the current invention, the programming order is similar to that proposed by Fastow et al, but the permissible encoding is constrained. With constraints, the programming steps may be coarser, thereby expediting the programming. Yet, because of the beneficial programming order, the constraints may be more relaxed than otherwise, thereby reducing the capacity loss due to unused combinations. Also, the constraints permit the elimination of problematic situations such as the ones described in the previous paragraph.

U.S. Pat. No. 7,613,068 ("Mokhlesi"), entitled "Read Operation for Non-Volatile Storage with Compensation for Coupling", discloses a scheme whereby programming is done without consideration of inter-cell coupling. At read time, however, the known coupling coefficients along with the measured Vt values of the cells in a group of cells are used to derive the intended levels of the cells.

The scheme of Mokhlesi features simple encoding at the expense of complex decoding. Also, while the scheme of Fastow et al did not require any knowledge of the inter-cell coupling coefficients, they must be estimated accurately (and must be uniform across the memory array) in order for the scheme to be operative. Thus, although theoretically Mokhlesi's scheme can also achieve a large number of levels with no encoding sacrifice, its practicality is questionable. It should be noted that constrained coding, unlike the scheme of Fastow et al, also requires some knowledge of the inter-cell coupling. However, only an upper bound on the maximum possible coupling is required, not a close estimate of the actual coupling.

Another embodiment of the current invention combines encoding restrictions (constrained coding) with smart decoding. For example, constrained coding is used to limit the change in Vt of a given cell "C" to less than two levels, and smart decoding is subsequently used to cancel the remaining effect. The result can be a less constrained encoding than in a pure application of constrained encoding, thereby increasing the encoding efficiency and thus capacity, while keeping the decoding relatively simple and partly relaxing the requirements on the accuracy of the estimation of the inter-cell coupling parameters and on their uniformity.

Throughout the description of the current invention, a given cell "C" was discussed and it was implied that any cell can be treated identically. In practice, however, with a finite group of cells being considered jointly, there are cells that lie at the edges of the group. These require different treatment. However, as is readily understood from the description of the current invention and the underlying phenomena, this would merely require an adjustment to the set of neighbors.

Whenever there are multiple neighboring groups of cells that are programmed independently, one may also consider inter-group effects, mostly the coupling among edge cells of neighboring groups. In one embodiment of the current invention, such an effect may be obviated by physically distancing neighboring groups from one another (at some loss of usable area). In another embodiment, the permissible levels of edge cells are restricted so as to ensure, for example, that the difference between the levels of neighboring different-group cells does not exceed a certain value.

The following example illustrates an example of a flash memory constrained coding framework:

1. Given the programming order, express the change to a cell's $V_t$ as a function of the charge levels of its neighboring cells. We refer this function as FG inter-cell coupling effect severity function.
2. Decide a value of the constraint T, which is the maximum value that the function in 1 may assume.
3. From 2, the components of distribution width and the coupling parameters, derive the distribution's width.
4. Determine the permissible number of charge levels (including the erase level) based on the range of $V_t$, the distribution widths in 3 and the required gap between adjacent distributions.
5. Through constrained coding techniques, define the constrained code and determine the maximum code rate $R \leq 1$; i.e., the fraction of cell-level combinations that satisfy the constraint on the function.
6. Compute the Flash cell storage capacity (FSC) as $FSC = R \cdot \log_2(L+1)$, where L+1 is the number of permissible charge levels per cell (including the additional levels made possible by the constrained coding).
7. Construct an encoder and a decoder either algorithmically or as a lookup table. Here, one may elect to trade some capacity for simplicity.
8. Repeat steps 2-7 in search of the constraint value that maximizes Flash cell storage capacity.

Remarks.

The constraint value in 2 may differ among levels.

In optimizing the constraint value, one can trade capacity for reliability (endurance, retention and transient bit error rate).

Coding Schemes for Breadth-First and Even-Odd Programming Orders

The following text provides an example of the use of constrained Flash programming in the context of two prominent programming orders Breadth-First and Even-Odd. As a baseline for each of them, one can use the unconstrained case. This results in R=1 (no restrictions), but also in the smallest number of charge levels. In both cases, we consider the relatively simple 1-D case (a single, very long row of cells). The 2-D case, albeit more complex, is basically the same, provided that 2-D blocks of cells are being programmed. The severity function (step 1) of cell c will be denoted D(c).

Figure 6A:
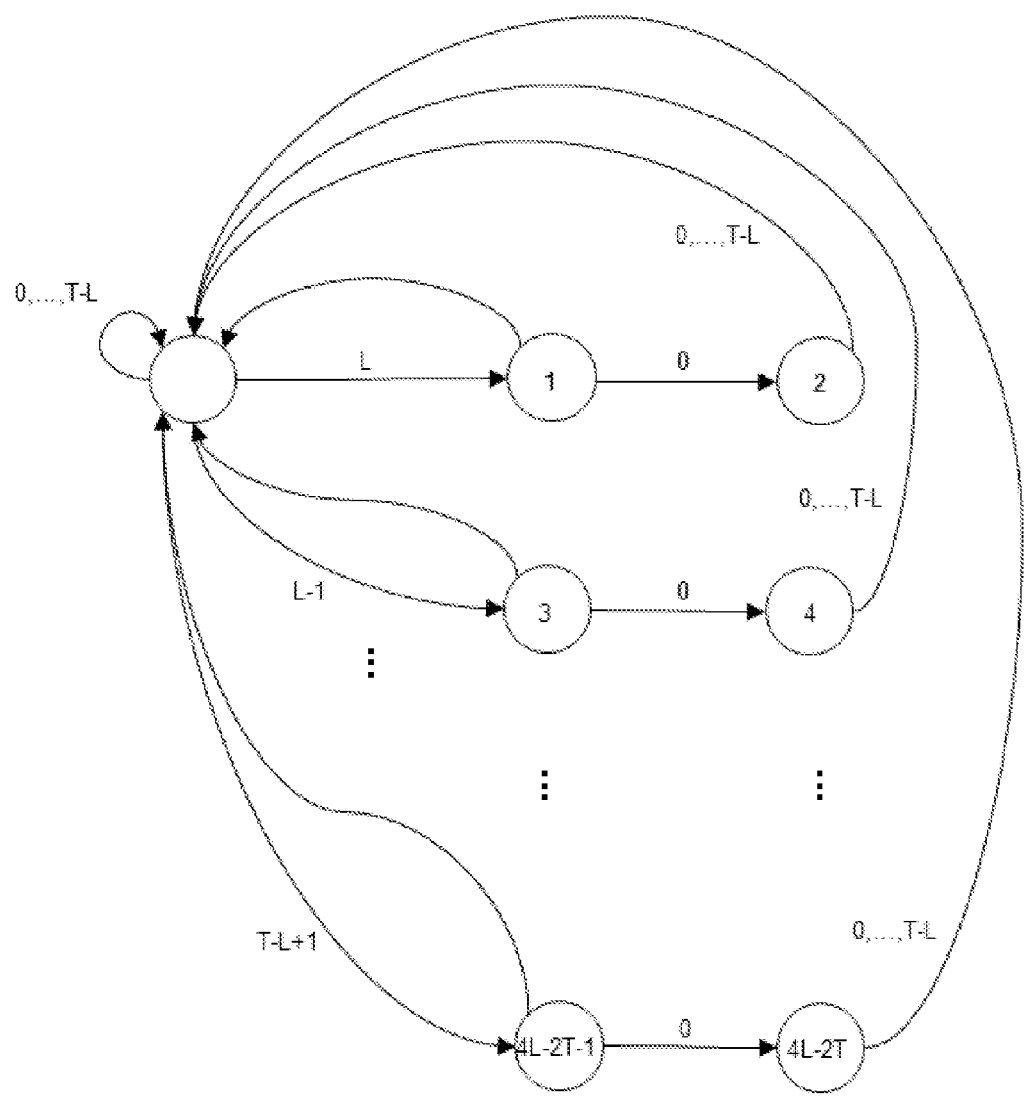

FIG. 6A illustrates a graph representation of a T-constrained code for Flash breadth-first programming order, $G_1$, includes 1+4L−2T vertices. A cell is capable of storing discrete levels {0 . . . L}.

FIG. 6B illustrates (a) additional edges labeled N between odd-index vertices i and even vertices numbered i+1+4N, where N=1, 2, 3, . . . , $\lfloor(4L-2T-i)/4\rfloor$ and (b) additional edges between even vertices j (j≥4) to vertices (4L−2T−1), (4L−2T−3), . . . , (4L−2T−(j−3)) labeled (T−L+1), (T−L+2), . . . , (T−L+(j/2−1)) respectively.

Figure 6C:
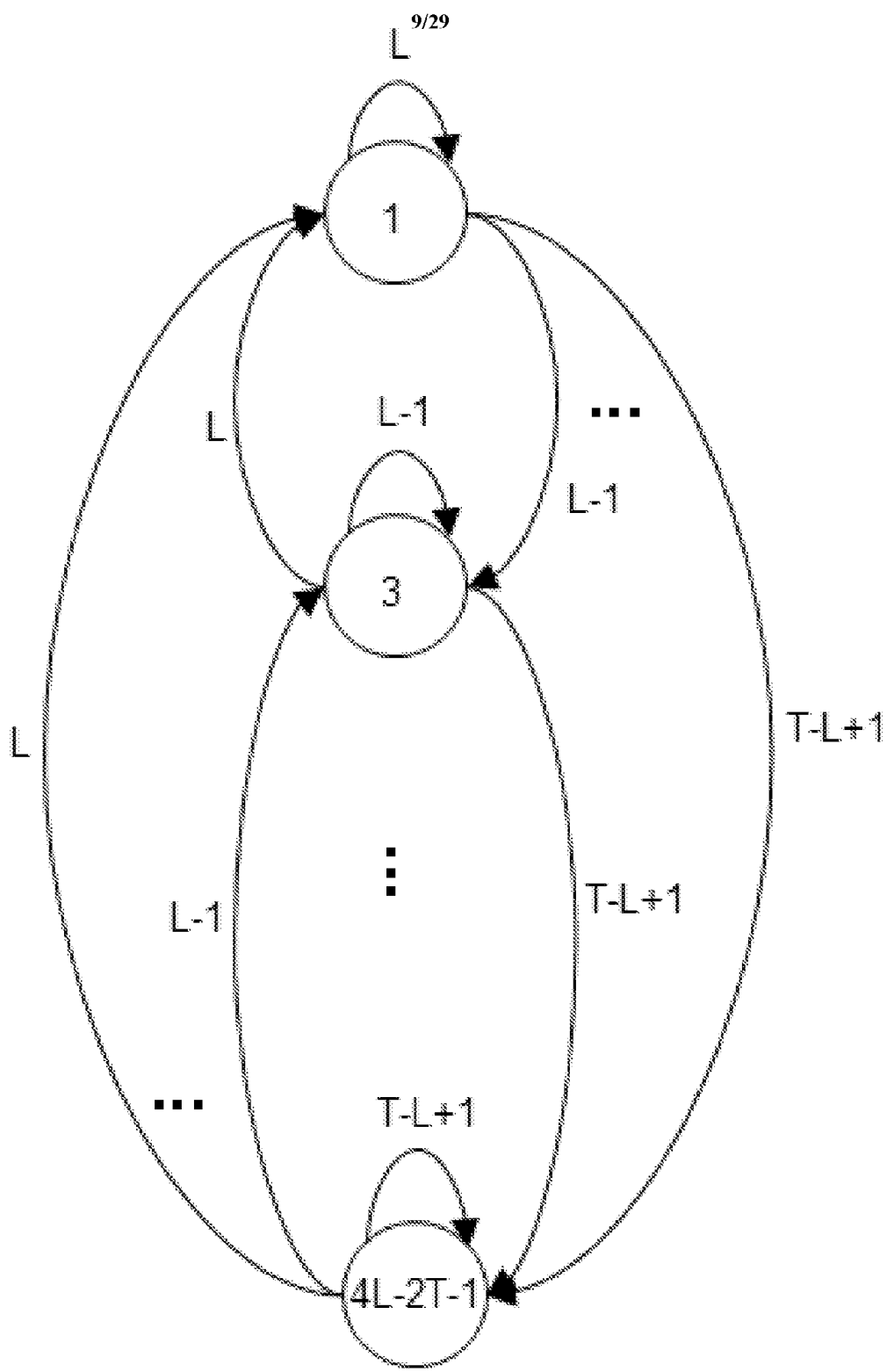

FIG. 6C illustrates additional edges, added only if labels are unique, between any odd vertex to all other odd vertices (including itself): an edge to vertex 1 is labeled L, an edge to vertex 3 is labeled L−1, and so on, with the edge to vertex 4L−2T−1 labeled T−L+1. It is noted that for simplicity of presentation, numbers separated by commas on the edge represent different labels on separate edges with the same source and destination vertices.

1. Breadth-First Programming Order (1-D)

Consider charge levels {0, 1, . . . , L} and the following programming order: all cells whose target levels are 1 or higher (Level(c)≥1) are programmed to level 1, including verification of Vt; next, all those s.t. Level(c)≥2 are programmed to level 2, and so on. Therefore, cell c is only affected by those of its neighbors whose charge levels are higher than its own, and only by the charge added to them after c's programming ended.

Accordingly, $$\Delta V_t(c) \propto D(c) \text{ and } D(c) = \sum_{\text{neighbors}} \max(\text{Level}(\text{neighbor}) - \text{Level}(c), 0)$$

Where Level (neighbor)—the charge level of cell's neighbor.

Definition: a 1-D T-constrained code for Flash breadth first program order is a set of finite words over the alphabet $\Sigma=\{0, 1, \ldots, L\}$, such that in a word $w=u_1 u_2 \ldots u_n$, for any letter $u_i$, 2≤i≤n−1 (without the edges) in w:

$$\max(u_{i-1}-u_i, 0) + \max(u_{i+1}-u_i, 0) \leq T, L \leq T \leq 2L-1.$$

Those of skill in the art will appreciate that the expansion of this definition to 2-D T-constrained codes is straightforward.

Code construction: A general graph representation of a T-constrained code for Flash breadth-first programming order is shown is FIGS. 6A-6B. Traversing the graph generates a legal codeword. The graph consists of 1+4L−2T vertices. For facility of exposition, we partition the graph edges into three components.

Figure 2:
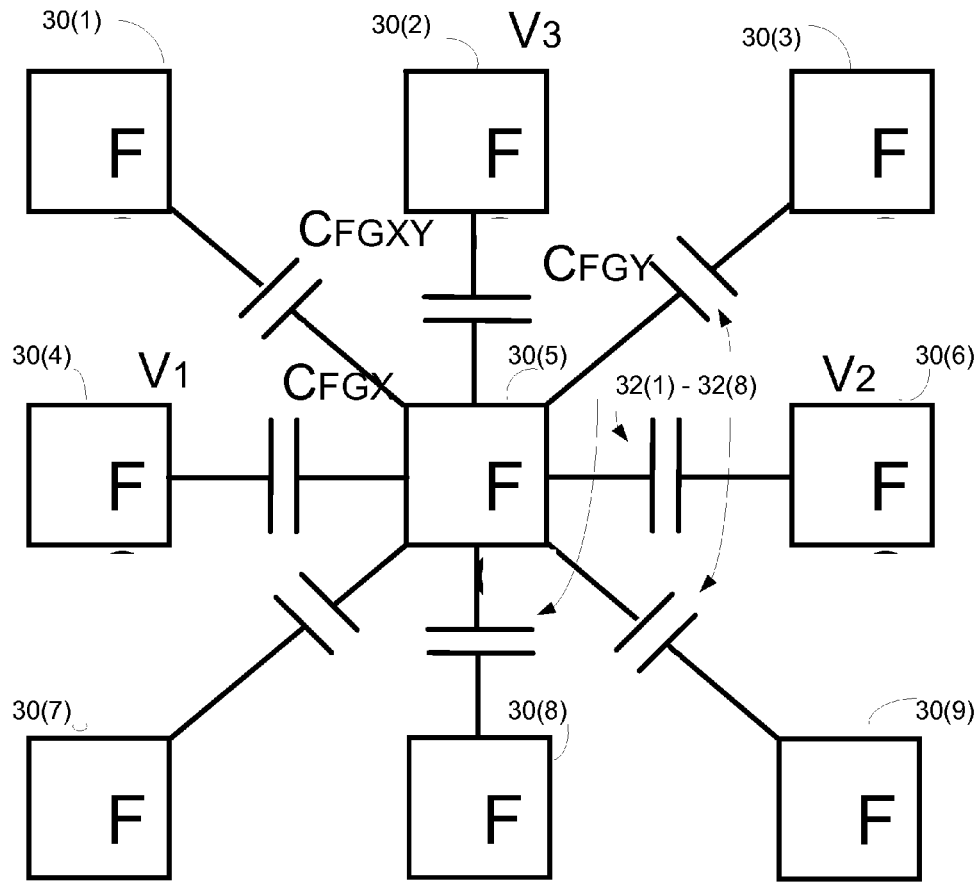
FIG. 2 illustrates inter-cell coupling capacitance between floating gates of a given cell ("C") and its neighboring cells ("Nn")

FIG. 6A shows all graph 610 vertices. The first vertex is not numbered. The edges are as follows: the first vertex is connected to all odd vertices (1, 3, . . . , 4L−2T−1) with an edge labeled L down to T−L+1, respectively. All odd vertices are connected to the first vertex, each with edges labeled {$\lfloor(4L-2T-2)/4\rfloor+1$, . . . , T−L}, {$\lfloor(4L-2T-4)/4\rfloor+1$, . . . , T−L}, . . . , {1, . . . , T−L}. Odd vertices are connected to consecutive even vertices with an edge labeled 0. Even vertices 2, 4, . . . , 4L−2T are connected to the first vertex with edges {0, . . . , T−L}, respectively. FIG. 2(b) top shows an edge labeled N from any given odd vertex i to the even vertices (i+1+4N), for N=1, 2, 3, . . . , $\lfloor(4L-2T-i)/4\rfloor$.

FIG. 6B shows an edge from even vertices j (j≥4) to odd vertices (4L−2T−1), (4L−2T−3), . . . , (4L−2T−(j−3)) with edges labeled (T−L+1), (T−L+2), . . . , (T−L+(j/2−1)), respectively. These edges and vertices are collectively denoted 620.

FIG. 6C shows edges from any odd vertex to all odd vertices (including itself): an edge to vertex 1 is labeled L, an edge to vertex 3 is labeled L−1, and so on, with the edge to vertex 4L−2T−1 labeled T−L+1. These edges and vertices are collectively denoted 630.

The graph $G_1$ in FIG. 6A represents a language for T-constrained Flash coding with breadth-first program order.

Consider a vertex, say $V_1$, in graph $G_1$. $V_1$ has one or more outbound edges. Let us select one edge and follow a certain path through two more vertices, such that $V_1 V_2 V_3$ are connected ($G_1$ is strongly connected). The sum of the initial edge's label and any outbound edge's label in $V_3$ is at most T. The combinations of any output edge from $V_1$ and any output edge from $V_3$ (where $V_1 V_2 V_3$ are connected) yield all possible values from 0 to T.

By allowing one to start from any edge and ensuring that all 3-symbol sequences are legal, we ensure correctness for a "sliding window" over the cell locations. ∎

Even-Odd Programming Order (1-D)

Consider a scheme whereby the even-numbered cells are programmed first, followed by the odd-numbered cells. Since an odd-numbered cell's neighbors are all even-numbered, its programming took place after theirs was completed, so it is unaffected. An even numbered cell, in contrast, is affected by the total charge of its two neighbors. Accordingly, $$D(c) = \begin{cases} 0, & c \text{ odd} \\ \text{Level}(c-1) + \text{Level}(c+1), & c \text{ even} \end{cases}$$

Clearly, no distribution narrowing takes place for odd-numbered cells (as no broadening occurred). Even numbered cells are affected by the total charge placed in their neighbors, independently of their own level, unlike with the breadth-first programming. Therefore, all $V_t$ distributions of even numbered cells are affected equally. Therefore, the encoding and decoding process consider only the odd cells. i.e., in the coding scheme, a sequence of $u_1 u_2 u_3$ represents cells in odd positions such as 1, 3, 5. Note that when calculating the Flash Storage Capacity (Algorithm 1 step 6), the code rate R refers only to half of the cells.

Definition: a 1-D T-constrained code for Flash even-odd program order (considering only the even cells) is a set of finite words over the alphabet E={0, 1, . . . , L}, such that in a word $w=u_1 u_2 \ldots u_n$, for any letter $u_i$, 1≤i≤n−1 in w: $u_i + u_{i+1} \leq T$, L≤T≤2L−1. (Only odd-index cells are included in code word).

We allow L≤T≤2L−1 because if T<L, a cell can never store L levels, and if T>2L−1 there is no constraint and all combinations are allowed.

Figure 7A:
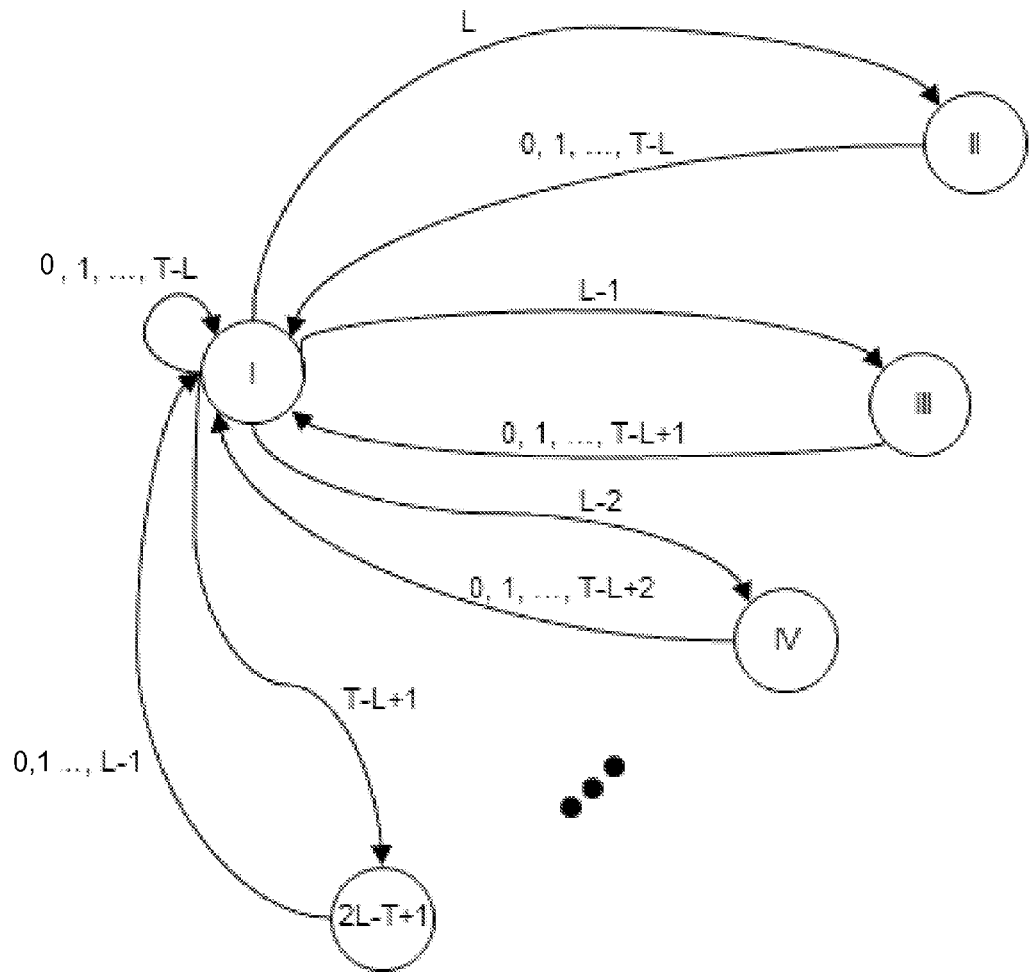

Code construction: A general graph representation of a T-constrained code for Flash Even-odd programming order is shown is FIG. 7A. The graph 710 consists of 2L−T+1 vertices. Vertex 1 is connected to itself with edges labeled 0, 1, . . . , T−L, and to vertices 2, 3, . . . , 2L−T+1 with edges labeled L, L−1, . . . , T−L+1, respectively. Vertices 2, 3, . . . , 2L−T+1 connect to vertex 1 with edges labeled {0, 1, . . . , T−L}, {0, 1, . . . , T−L+1}, . . . , {0, 1, . . . , L−1} respectively. FIG. 7B shows the corresponding adjacency matrix 720.

A T-constrained language for Flash even-odd program order is represented by graph $G_2$, depicted in FIG. 7A-7B.

For each vertex i, 2≤i≤2L−T+1, in graph G, there is one input edge, labeled L+2−i. Each of those vertices contains output edges, ranging from 0 to T−L−2. Therefore, the maximum sum of adjacent labels is T, and all lower sums can Referring back to FIG. 7A, for state 1, its input edge labels range from 0 to L−1 (since L≤T≤2L−1, T−L≤L−1) and its output edges range from T−L+1 to L. Therefore, the maximum sum of adjacent labels is T, and all lower sums can be obtained.

Graph $G_2$, depicted in FIG. 7A, is the Shannon cover of T-constrained code for Flash even-odd program order. i.e., graph $G_2$ generates the constrained language of T-constrained code for Flash with the minimum number of states.

G is deterministic, as none of its vertices has multiple outbound edges with the same label. Let us examine the follower sets of all vertices in graph G. For each vertex i, 2≤i≤2L−T+1, all output edges are directed to vertex 1. Since G is deterministic, any length-2 word that begins and ends in vertex i is unique to its follower set. As for vertex 1, the word 00 is unique to its follower set since all output edges are labeled more than 0, as L≤T, T−L+1>0. Therefore, all follower sets of the graph's vertices are different, hence graph G is reduced. G is irreducible as it is strongly connected: from any two vertices u and v, there is a path from u to v and path from v to u. vertex 1 is connected to all other vertices and vice versa. A path from any vertex u to vertex v is u→1→v.

Graph G is deterministic, reduced and irreducible. Therefore, G is a Shannon cover of T-constrained code for Flash even-odd program order.

Example of the graph where T=4, L=4 and its corresponding matrix is shown in FIG. 9.

Additional properties of the Breadth-first and Even-odd constrained languages are discussed below. The additional properties include that FIG. 6A is the Shannon cover of the corresponding language.

The language S, represented by the graph G has finite memory, and m(S)=m(G)=2.

Let examine all words in length 2 in graph G. All words that end with 0 are ending at vertex 1. Therefore all words in length 2 that end with 0 are focusing words. Same is to all words that end with 1, 2, . . . , T−L.

Regarding words $w_1w_2$, that end with T−L+1: if $w_1 \in \{0, 1, \ldots, T-L\}$ than word ends in vertex 2L−T+1. Else, if $w_1 \in \{T-L+1, \ldots, L-1\}$ word ends in vertex 1. For words that end with T−L+2, if $w_1 \in \{0, 1, \ldots, T-L\}$ than word ends in vertex 2L−T. Else, if $w_1 \in \{T-L+1, \ldots, L-2\}$ word ends in vertex 1.

We can repeat this in general, For words that end with T−L+k, if $w_1 \in \{0, 1, \ldots, T-L\}$ than word ends in vertex 2L−T+(k−2). Else, if $w_1 \in \{T-L+1, \ldots, L-k\}$ word ends in vertex 1. The memory of G is not 1, as for example, the word L−1 can end in vertex 1 or in vertex 3. Therefore, every word in length 2 in G is a focusing word. Hence, the memory of G is 2, and since G is a Shannon cover of S, m(S)=m(G)=2.

According to constrained coding theory, we annotate a language S, of all legal words (word—block of bits) at length/ by N(1; S). The capacity of S, i.e., the maximum achievable code rate is:

$$Cap(S) = \lim_{l \to \infty} \frac{\log_2 N(l; S)}{l}$$

In the case of non-binary alphabet, (multi-bit per cell, MLC), we need to normalize the previous equation. Assuming that there are L levels per cell, the capacity:

$$Cap_{Norm}(S) = \frac{\lim_{l \to \infty} \frac{\log_2 N(l; S)}{l}}{\log_2(L+1)}$$

In case that finding N(1; S) is complex, we can calculate the code rate through Perron eigen-value (highest eigen-value) of the corresponding matrix $A_G$ of the constrained language graph G, $\lambda(A_G)$. In our case:

$$Cap_{Norm}(S) = \frac{\log_2 \lambda(A_G)}{\log_2(L+1)}$$

We calculate this equation with various different T and L values. Results are shown in FIG. 9A-9B.

Figures 9A, 9B:
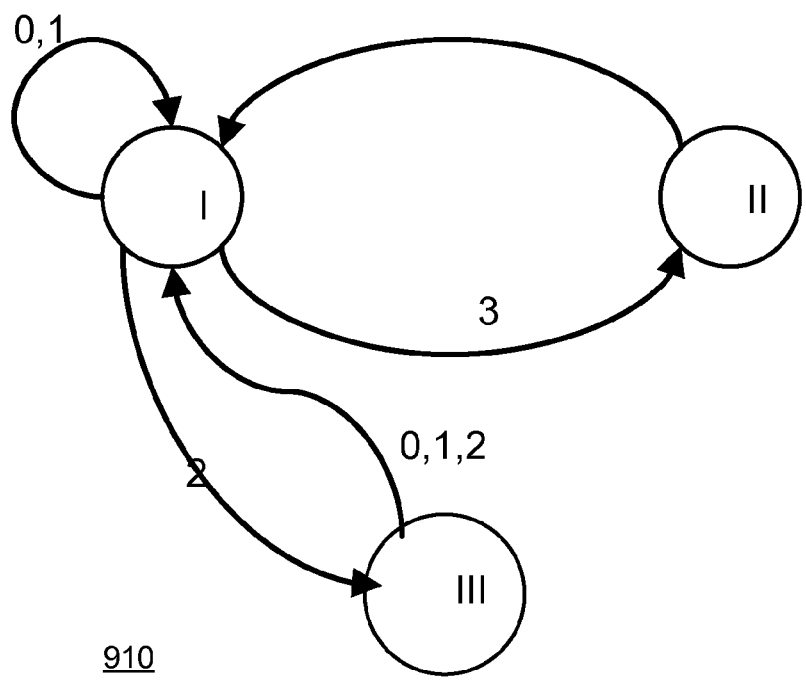
Figure 10A:
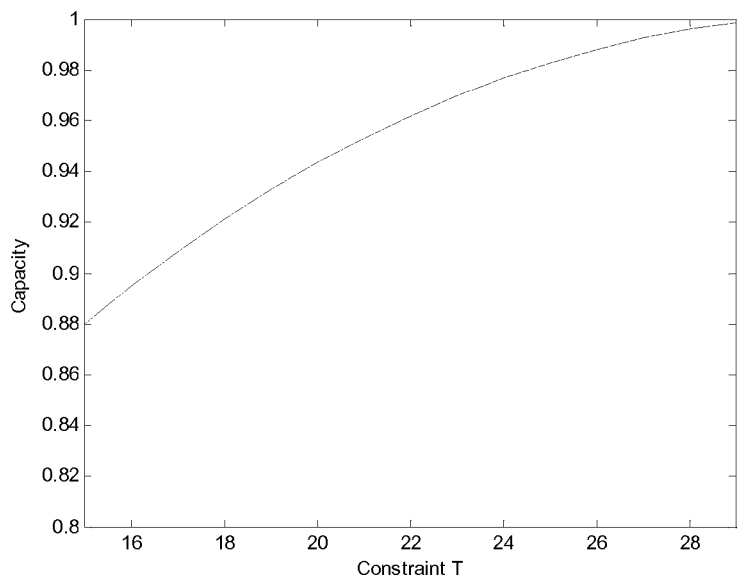
Figure 10B:
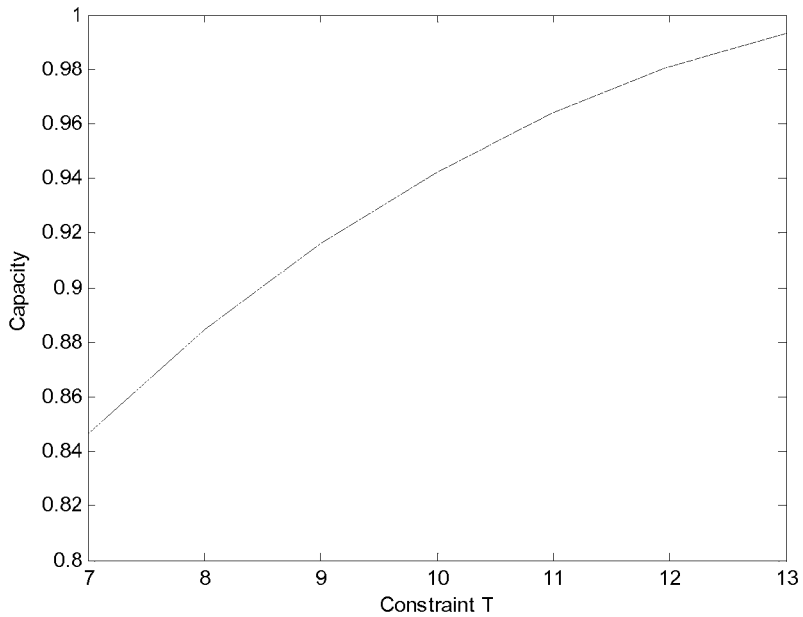
Figure 10C:
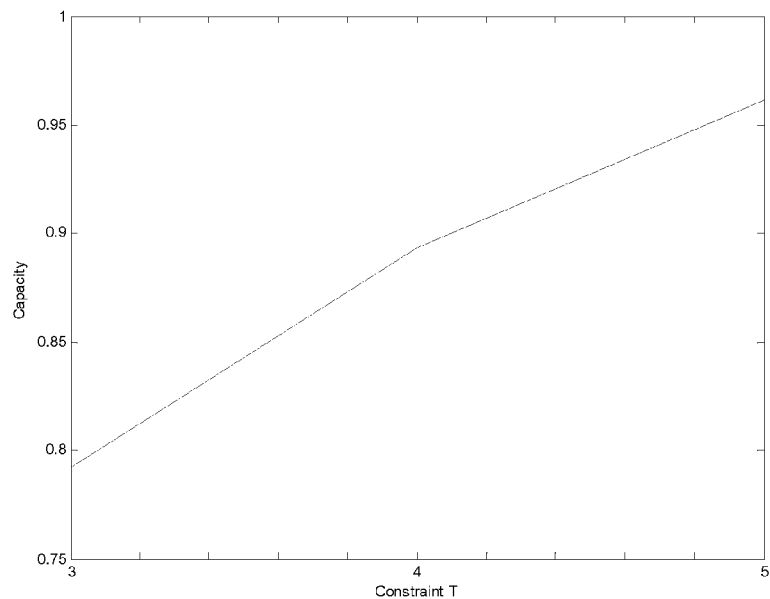
Figure 10D:
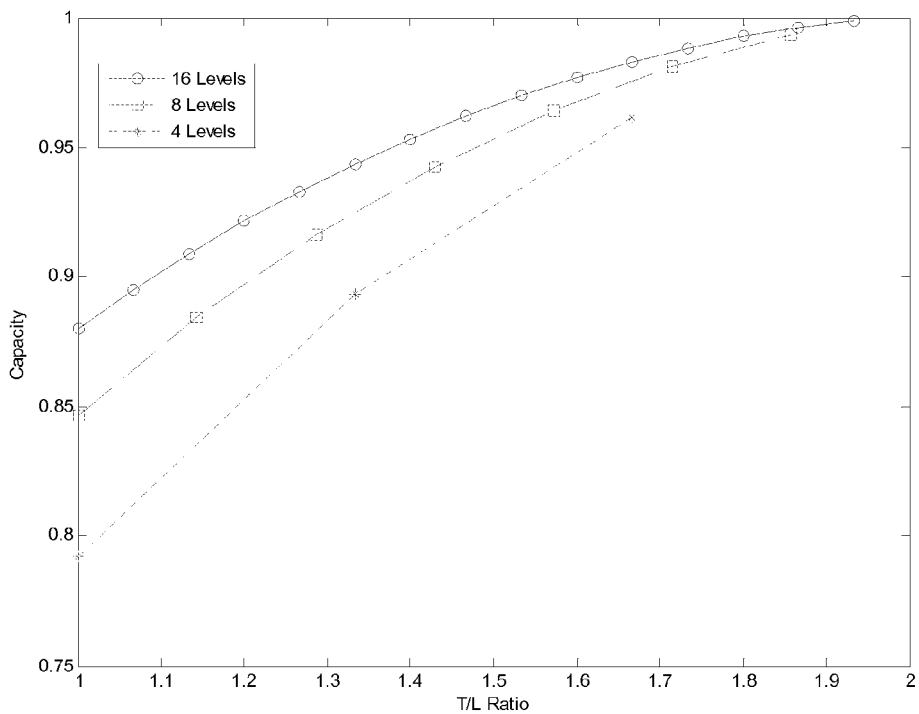

FIG. 9A illustrates an example of graph representation 910 of Flash even-odd programming order constrained code, T=4 and L=4-level cell. FIG. 9B illustrates a corresponding matrix 920.

FIGS. 10A-10D illustrate and especially curves 1010-1040 of these figures an exponential increase in the capacity with linear increment of the constraint T. For example, at 16-level cell, we observe that as moving to high bit-per-cell architectures (i.e., more level per cell—higher L), the capacity is relatively higher comparing the same T/L ratio.

Figure 8A:
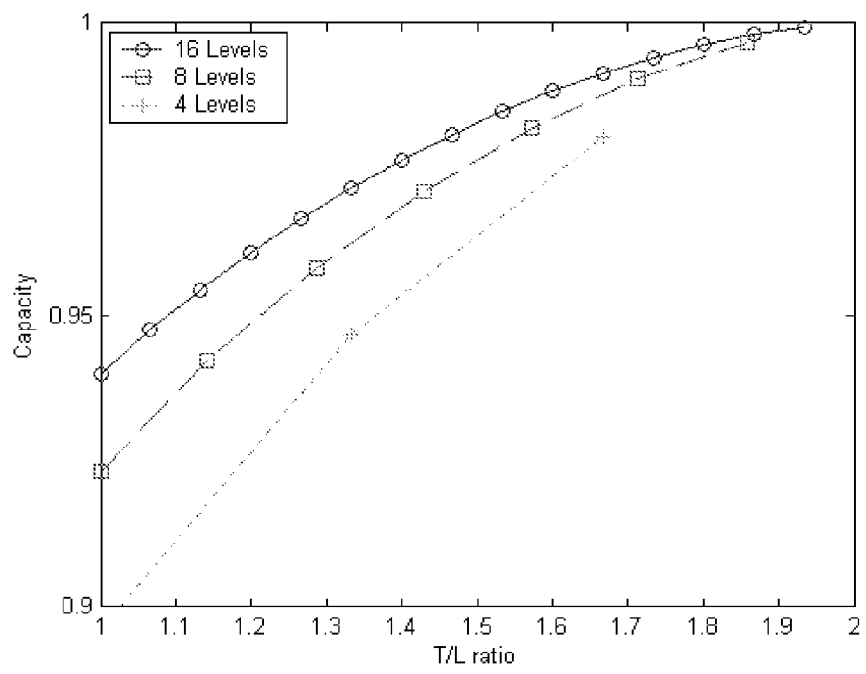
FIGS. 8A-8B and 10A-10D illustrate the relationships between code capacity and T/L ratio, according to various embodiments of the invention.
Figure 8B:
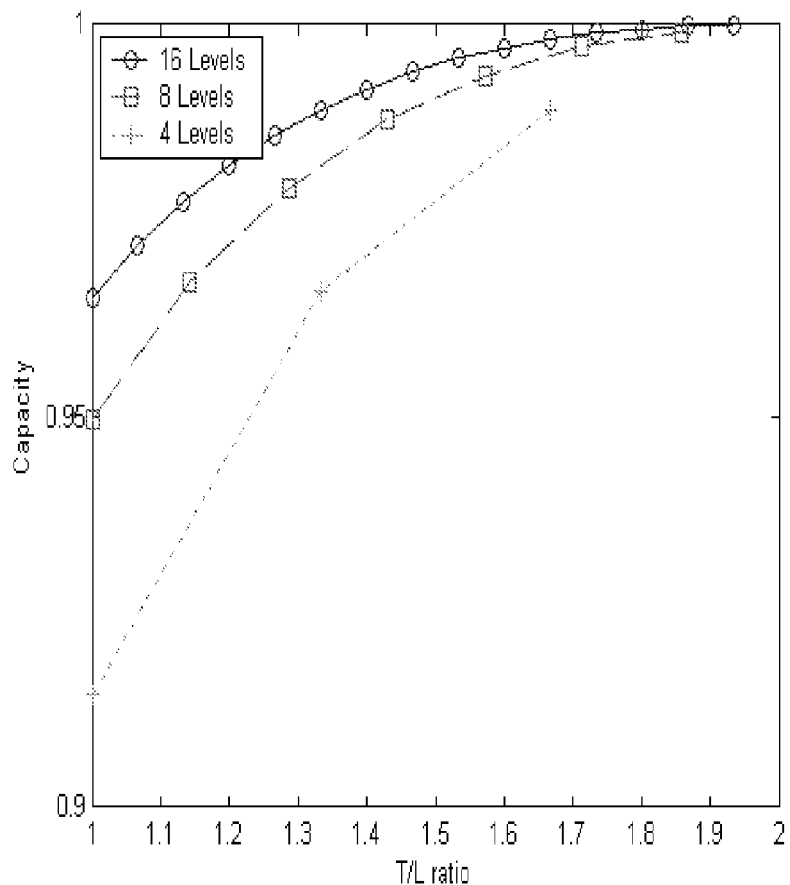

Accurate capacity results for constrained codes of Breadth First and Even-Odd programming orders, for various T and L values, are shown in FIG. 8A-8B. Since the alphabet is not binary, the language capacity can be greater than 1. We normalize this capacity by dividing it by the ideal number of bits per cell, so that maximum capacity is 1.

Flash memory is programmed in pages, typically 2 KB. Choosing the rate of the code has implications, as the block sizes may be bounded by the page size, or, if one chooses to work with rates higher than page size it should have proper system support, such as interleaving writes.

Step 4: New Capacity/Reliability Calculation

Using the voltage threshold gain by constrained inter-cell coupling, we can calculate the flash storage capacity (FSC). We denote R as the selected code-rate, and L as the number of levels in Flash cell. The Flash cell storage capacity:

$$FSC = R \cdot \log_2(L)$$

Figure 11A:
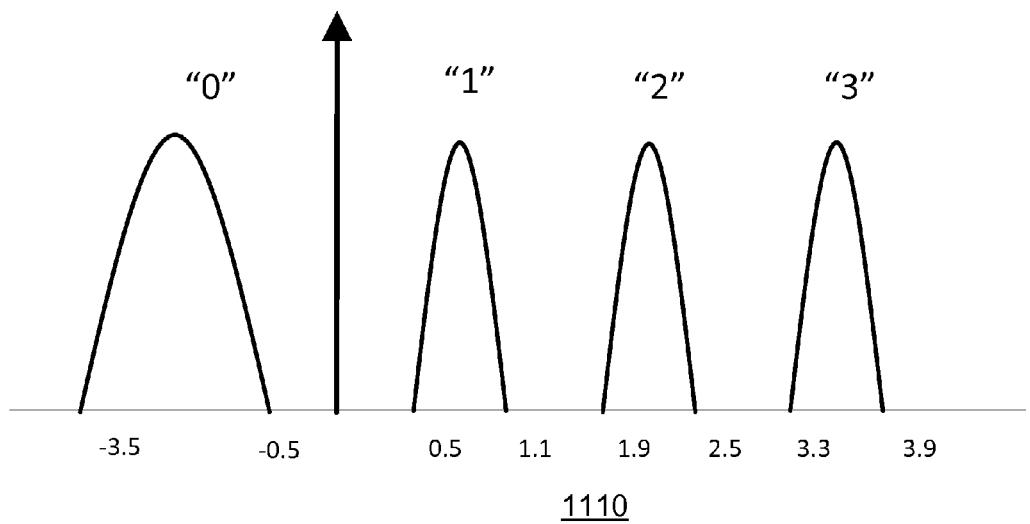
FIGS. 11A-11B illustrate examples according to an embodiment of the invention.
Figure 11B:
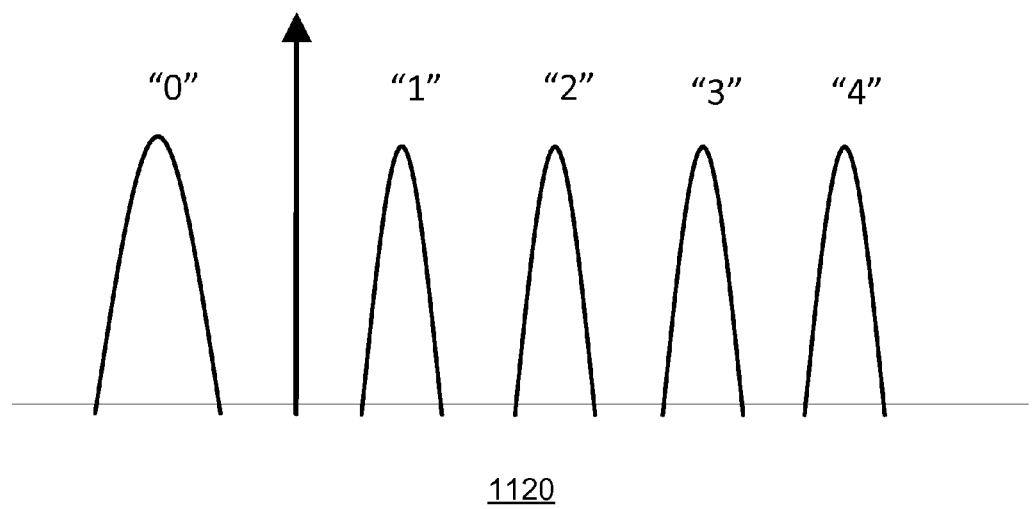

For example, consider the baseline as the uncoded case, where R=1 and L=4. FSC=1 $\log_2(4)$=2 bits per cell, as depicted in FIG. 11A. In case we used constrained coding with code-rate 0.95, the voltage threshold distributions got narrower, and as a result, we can store 5 levels instead of 4, as depicted in FIG. 11B. The new flash storage capacity is FSC=0.95 $\log_2(5)$=2.2 bits per cell, which is further 10% increased capacity comparing the uncoded case.

The margin enhancement with constrained coding can also be used to increase Flash reliability (i.e., without adding more distributions) such as endurance and retention parameters. The exact improvement as a function of the constraint threshold depends in the specific manufacturing technology.

Step 6: Encoder and Decoder Construction

Using the constrained language graph, according to code definition in step 3, encoder and decoder can be generated. First, according to the code rate, R, find appropriate p:q ratio such that R=p/q, where p is for input data, and q for output encoded data. Second, the constraint language graph has to be multiplied, so that every node will have $N^q$ output edges, where N is the number of levels per cell. The state spitting algorithm may be needed to achieve q output edges. Third and final step is to allocate the input data on the edges, such that every edge will have two labels: encoding data and decoding data. Encoding is done when walking on the graph, transforming the input data to the encoded data, and decoding is done the same way in reverse.

Flash memory might suffer from transient errors due to, for example, oxide degradation. In order to avoid error prorogation, appropriate error-correction codes may be combined with constrained Flash coding, or other error-correction techniques, which will be discussed in the related work Section. In some cases, encoder and decoder may be implemented with lookup table instead of a state machine, to eliminate error propagation from constrained coding. An example of such a case is where multiplication of the constrained graph by q would result in a graph wherein at least one of its vertices has $(L+1)^q$ self-directed edges.

For example, consider the case of even-odd programming order, L=3, and T=4. The capacity (i.e., optimal code rate) is 0.8913 and the constrained language graph is depicted in FIG. 9A. For simplicity, we will construct an encoder and a decoder for code rate of R=2/3. We choose the p:q ratio to be 2:3, i.e., the input for the encoder is two cell levels, and the output encoded data is three cell values. The decoding process is vice versa. The next step is to multiply the graph by the number of output cells (3), (multiplying the graph is keeping the nodes and constructing new edges of length 3, i.e., by walk on three edges, while deleting the old edges). The result 1210 is depicted in FIG. 12A, the corresponding matrix 1220 is depicted in FIG. 12B).

The new graph is a state machine of the encoded data. In order to turn it into an encoder/decoder, we need to allocate the user input data, i.e., two cells values (there are $4^2=16$ possibilities) on each node's output edges. Since that there are more than 16 output edges from each node, there are redundant edges, which we can delete without impact on the code rate. For example, in the first node there are 28 output edges, therefore, 12 can be deleted. The input data allocation can be done arbitrarily, or else, accounting for other coding properties. Various algorithms for the decision on which redundant edges to delete and how to allocate the input data can be applied.

An example for complete state machine 1310 of encoder and decoder is given in FIG. 13. The fact that we have a node with at least 16 output edges self-directed to it at $G^3$, we can implement the encoder/decoder with a look-up table as illustrated below. The design complexity of the encoder and decoder state machine grows as the code rate gets higher. Therefore, one may elect to trade some capacity for simplicity.

| Info | code-word |
|---|---|
| 00 | 000 |
| 01 | 001 |
| 02 | 010 |
| 03 | 011 |
| 10 | 100 |
| 11 | 101 |
| 12 | 110 |
| 13 | 111 |
| 20 | 020 |
| 21 | 021 |
| 22 | 022 |
| 23 | 120 |
| 30 | 121 |
| 31 | 122 |
| 32 | 200 |
| 33 | 201 |

2-D Expansion

We expand the definition of constrained coding for Flash memory in two- and three-dimensional constraints. When considering 2-D constrained coding for Flash, one should consider the programming order of the lines (wordline) in addition for the programming order of the cells in the same line, which was required in the 1-D scheme.

2-D $(T_1, T_2, T_3)$ constrained code for Flash with even-odd program order and row-by-row wordline programming, with wordline length N, and number of wordlines M, is set of finite M×N arrays over the alphabet $\Sigma=\{0, 1, \ldots, L\}$, where $w_i+w_{i+1} \leq T_1$, $b_{i-1}+b_i \leq T_2$, $d_{i-1}+d_i \leq T_3$, $L \leq T_1 \leq 2L-1$, $L \leq T_2 \leq 2L-1$, $L \leq T_3 \leq 2L-1$.

Where: $w_i$, $w_{i+1}$ are adjacent cells in the same wordline (row); $b_{i-1}+b_i$ are upper and current cells in the same bitline (column); $d_{i-1}+d_i$ are upper and current cells in the same diagonal.

2-D constrained codes for Flash have three constraints $T_1$, $T_2$, $T_3$. The constrains limit the sum of adjacent cells in each direction. Future proposed Flash cells have a 3-D structure, and the expansion of 2-D constrained code to 3-D is straightforward, having $(T_1, \ldots, T_6)$ constraints, for each of the available directions.

Constrained coding is a beneficial approach to mitigate inter-cell coupling effect. It can also be used in a various ways, either to mitigate undesirable deep sub-micron effects, or in other ways, e.g. to guarantee programming speed by limiting the number of levels to program.

Occurrence of error in constrained coding patterns can result in error propagation in consecutive data patterns. This can be solved with encoder/decoder schemes which combine constrained coding with error correction codes. The constrained codes also have inherent capability for error correction.

As indicated above, constrained coding, whereby those adjacent-cell charge combinations that result in the greatest threshold voltage shifts are forbidden, has been proposed to mitigate this distribution broadening.

The "locally optimal" constrained coding scheme is a function of the array programming algorithm and of the chosen value of a constraint parameter (that represents a trade-off between code rate and the extent of distribution narrowing). Memory capacity can be maximized by jointly optimizing the parameter value and the corresponding code.

According to another embodiment of the invention there are provided decoding algorithms that may be combined with a constrained coding scheme in handling the case of illegal codeword read. This combination may take advantage of the unique flash channel characteristics Consider, for example, the case of charge levels $\{0, 1, \ldots, N\}$ and a "breadth-first" programming order: all cells whose target levels are 1 or higher ($L(C) \geq 1$) are programmed to level 1 (including verification of $V_t$); next, all those s.t. $L(C) \geq 2$ are programmed to level 2, and so on.

Because of the programming order and the $V_t$ verification at each level (multiple programming pulses are used between consecutive levels, so a cell's $V_t$ at the end of its own programming is essentially at the nominal value despite the effect of neighboring cells), a cell c is only affected by those of its neighbors whose charge levels are higher than its own, and only by the charge added to them after C's programming ended.

Thus, for cell c:

$$\Delta V_t(c) \propto D(c)$$

$$D(c) = \sum_{neighbors} \max(L(neighbor) - L(c), 0)$$

With a 2-D array of cells (8 neighbors including the diagonals), $0 \leq D(c) \leq 8N$. Constrained coding can ensure that $D(c) \leq T$, where T is the constraint parameter.

FIG. 14 depicts a constrained language graph for a 1-D (2 neighbors), 8-levels (i.e., ideally 3 bits) per cell, breadth-first programming algorithm with T=13. (Traversing the graph edges will generate legal codewords, i.e., $D(c) \leq 13$). In this language, the legal codewords do not contain the sequence 7-0-7 (representing levels of adjacent cells).

The capacity of this language is $Cap(S)=\log_2\lambda(A_G)=2.99$ (R=2.99/3=0.99), where $\lambda$ is the Perron eigenvalue of the adjacency matrix $A_G$. Encoder and decoder at rate p/q (where p is the input block of cell levels to be encoded, and q is the corresponding output encoded block, $p/q \leq Cap(S)$) can be obtained by multiplying the graph by q, removing redundant edges, and using the state-splitting algorithm as necessary.

Combining error correction schemes with constrained coding can be performed by enlarging the Hamming distance between codewords. However, Flash memory channel properties and capacity estimation are yet to be known. Our focus here is on decoding algorithms for the case that an illegal codeword was read due to errors induced by retention.

Figure 15:
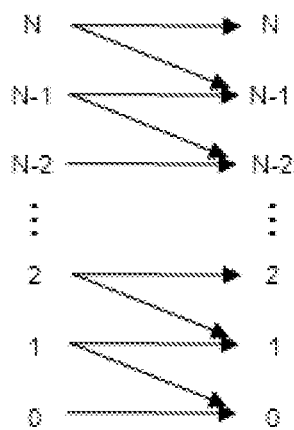
FIG. 15 illustrates an effect of retention of stored program levels.

Retention errors are due to charge leakage from the floating gate layer. They are uni-directional towards the erased level (level 0), as depicted in FIG. 15 (without using advanced techniques such as a moving read reference). The charge leakage rate directly influences retention time. It depends on the tunnel oxide width, which is relatively equal (up to process variations) for all cells, and on the amount of charge in the floating gate. The error probability at any given level depends on the charge leakage rate at that level and on the margin, i.e., the difference between the level's nominal $V_t$ and its Read reference $V_t$.

Illegal words resulting from a retention-related error correspond to situations in which $D(c) > T$ for at least one cell. Assuming that one error had occurred, it is most likely that the error is a result of the charge leakage from the cell c such that the lowering of c's charge level while keeping those of its neighbors unchanged results in an illegal neighbor-charge level combination. (Charge leakage from a neighbor cell would usually reduce D(c), resulting in a legal codeword.)

Since the subject changes occur in neighboring cells after c's programming was completed, they affect c's $V_t$ regardless of original programming order. So, leakage in a neighboring cell could pull c down one level. However, this leakage would have to be dramatic (by more than one level) for this to happen, so the resulting codeword would be legal unless leakage is so dramatic that data is probably lost altogether.

Constrained inter-cell interference coding can be used to detect and correct retention errors. However, many retention errors do not cause illegal codeword read. In order to increase the probability that retention error will cause illegal codeword read, we suggest two methods: 1) tuning of the Flash memory read channel, and 2) adding constraints that capture retention errors. Note that decreasing T (i.e., stricter constraints) always increases the probability of an error due to leakage resulting in an illegal read codeword and thus in a detectable error.

Figure 16:
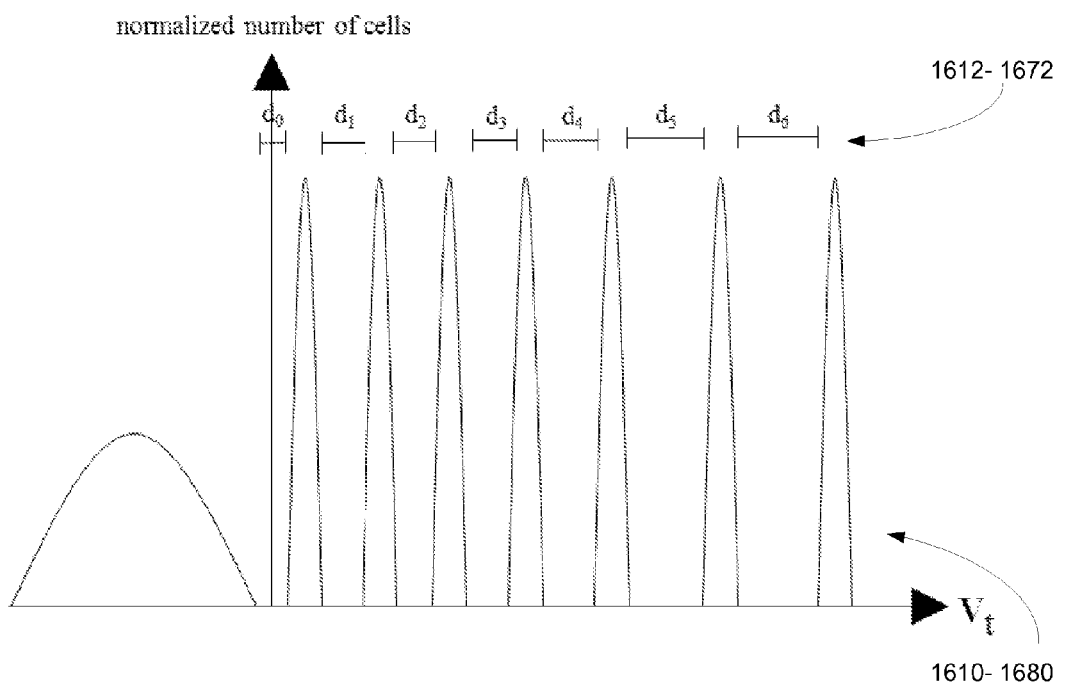
FIG. 16 illustrates eight voltage threshold distributions 1610-1680 for eight program levels, according to an embodiment of the invention.

Channel tuning. For simplicity, we examine the case of codewords of length three. We observe that illegal words contain the sequences $L_1$-0-$L_2$, $L_1$-1-$L_2$, $L_1$-2-$L_2$, $L_1$-3-$L_2$, ..., $L_1$-N-$L_2$, according to constraint T. The first sequence has the largest number of illegal words, the second largest number is the second sequence, and so on. Therefore, changing the Flash memory channel so that: $P_{N \to N-1} < P_{N-1 \to N-2} < P_{N-2 \to N-3} < \ldots < P_{2 \to 1} < P_{1 \to 0}$ would increase the probability that a retention error will cause illegal codeword read. This modification can be made by unequal allocation of "safety" margins (gaps) between adjacent levels, as depicted in FIG. 16, so that lower program levels will have smaller margins than higher ones. FIG. 16 illustrates eight voltage threshold distributions 1610-1680 for eight program levels (eight lobes), wherein the gap between pairs of adjacent lobes increases with program level. Gaps 1612-1672 are uneven.

Adding Constraints.

Figure 17:
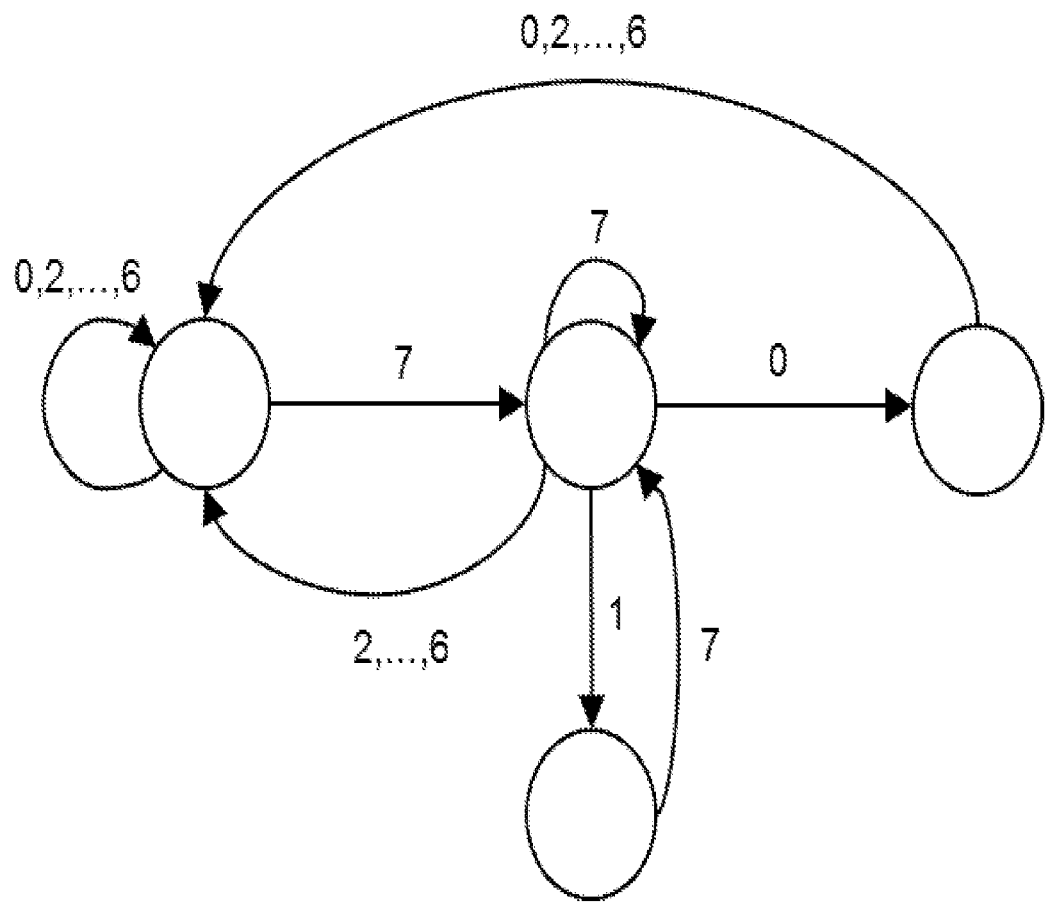

Legal codewords are, in one example, constrained to be offsets of illegal words, such that retention errors that fit the mentioned above probability equation lead to illegal words. For example, in FIG. 17, all legal codewords with 1 are 7-1-7. This reduces the rate from 0.99 to 0.93, but we observe that as the constraint T is lower, the reduction of code rate as a result of such constraint becomes lower.

In the event of multiple errors during read, i.e., multiple cells in which D(c)>T, the decoding scheme first focuses on the cell with the most higher-level neighbors and corrects it. The process is then repeated until a legal codeword is reached.

Figure 18:
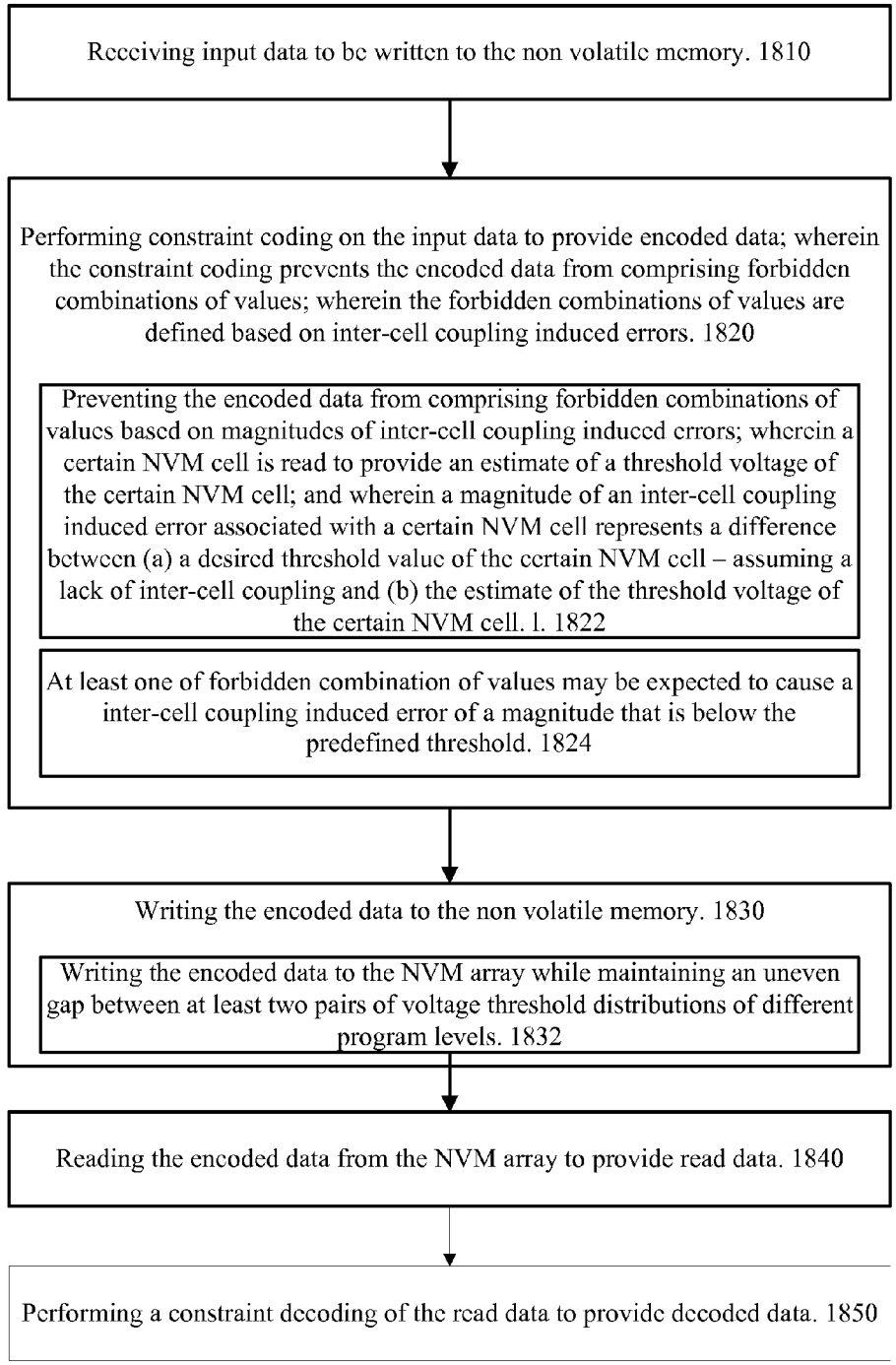
FIGS. 18-19 illustrate methods according to various embodiments of the invention.

FIG. 18 illustrates method 1800 according to an embodiment of the invention. Method 1800 is for operating a non volatile memory (NVM) array that includes multiple NVM cells.

Method 1800 may start by stage 1810 of receiving input data to be written to the non volatile memory.

Stage 1810 is followed by stage 1820 of performing constraint coding on the input data to provide encoded data; wherein the constraint coding prevents the encoded data from comprising forbidden combinations of values; wherein the forbidden combinations of values are defined based on expected inter-cell coupling induced errors resulting from coupling between NVM cells.

The forbidden combinations of values may correspond to forbidden combination of actual threshold voltages of adjacent NVM cells.

Stage 1820 may include at least one of stage 1822 and 1824.

Stage 1822 may include preventing the encoded data from comprising forbidden combinations of values based on magnitudes of the inter-cell coupling induced errors. A certain NVM cell is read to provide an estimate of a threshold voltage of the certain NVM cell. A magnitude of an inter-cell coupling induced error associated with a certain NVM cell represents a difference between (a) a desired threshold value of the certain NVM cell—assuming a lack of inter-cell coupling and (b) the estimate of the threshold voltage of the certain NVM cell.

Stage 1824 may include preventing the encoded data from comprising forbidden combination of values that are expected to cause an expected inter-cell coupling induced error of a magnitude that is above a predefined threshold.

At least one of forbidden combination of values may be expected to cause an inter-cell coupling induced error of a magnitude that is below the predefined threshold.

Stage 1820 may be followed by stage 1830 of writing the encoded data to the non volatile memory.

Stage 1830 may include stage 1832 of writing the encoded data to the NVM array while maintaining an uneven gap between at least two pairs of voltage threshold distributions of different program levels.

The gap between a first pair of voltage distributions of a first pair of program levels may be lower than a gap between a second pair of voltage distributions of a second pair of program levels, wherein the first pair of program levels are lower than the second pair of program levels.

Stage 1830 may be followed by stage 1840 of reading the encoded data from the NVM array to provide read data.

Stage 1840 may be followed by stage 1850 of performing a constraint decoding of the read data to provide decoded data.

Stage 1850 can include error correction. For example, stage 1850 can include detecting forbidden combinations of values in the read data and converting the forbidden combination of values to allowed combination of values. The converting may be responsive to an expected effect of retention on the encoded data.

Figure 19:
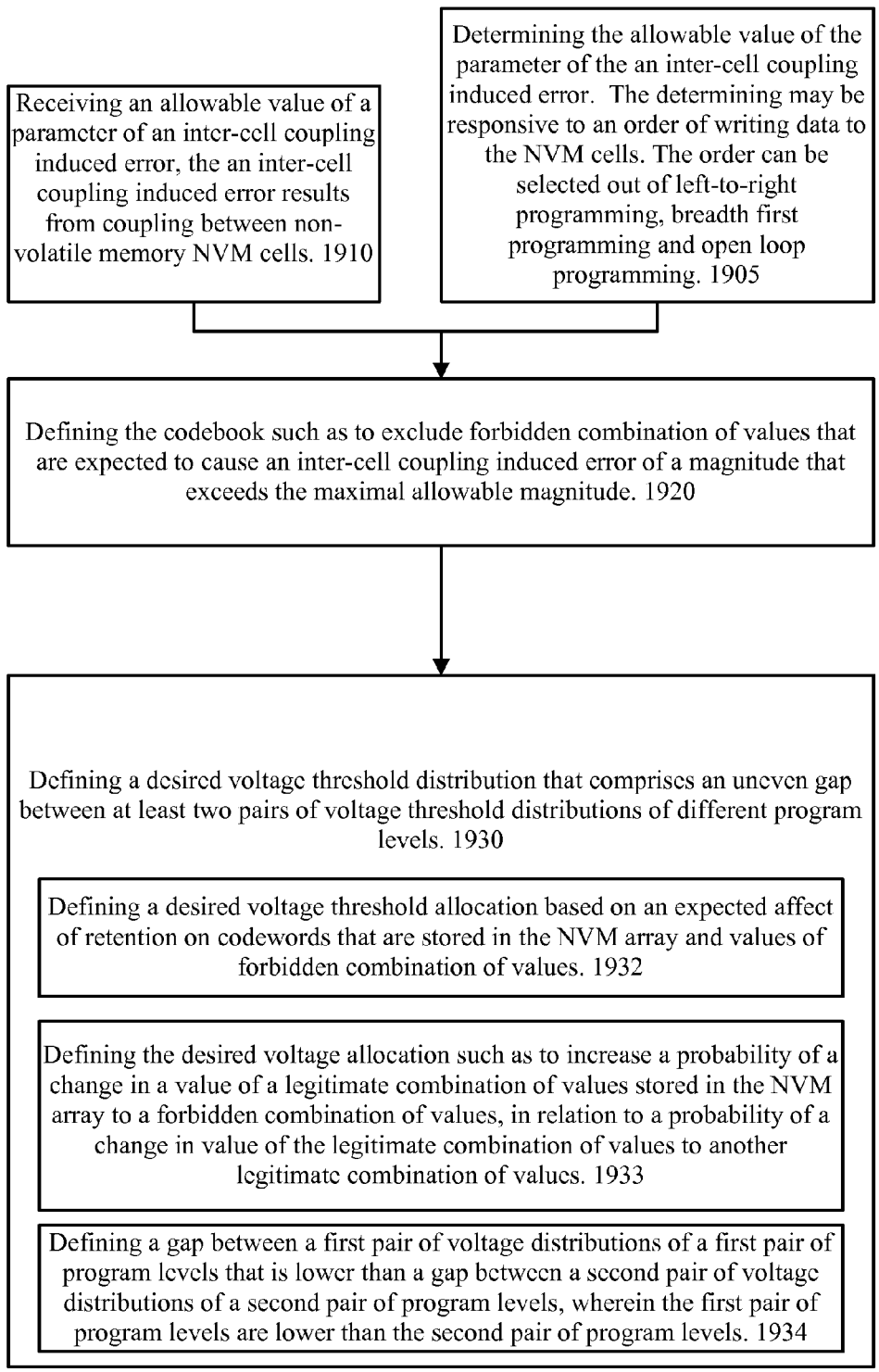

Method 1800 may use a codebook for constraint encoding and decoding that may be generated by method 1900 of FIG. 19.

FIG. 19 illustrates method 1900 according to an embodiment of the invention. Method 1900 is for providing a codebook of a constraint code. FIG. 20 illustrates various stages of method 1900 according to an embodiment of the invention.

Method 1900 may start by either one of stage 1905 and 1910.

Stage 1905 may include determining the allowable value of the parameter of the inter-cell coupling induced error. The determining may be responsive to an order of writing data to the NVM cells. The order can be selected out of left-to-right programming, breadth first programming and open loop programming or any other programming order and scheme.

Stage 1910 may include receiving an allowable value of a parameter of an inter-cell coupling induced error, the inter-cell coupling induced error results from coupling between non-volatile memory (NVM) cells.

The allowable value of the parameter may be a maximal allowable magnitude of the inter-cell coupling induced error; wherein a certain NVM cell is read to provide an estimate of a threshold voltage of the certain NVM cell. The magnitude of an inter-cell coupling induced error associated with a certain NVM cell represents a difference between (a) a desired threshold value of the certain NVM cell—assuming a lack of inter-cell coupling and (b) the estimate of the threshold voltage of the certain NVM cell.

Stage 1910 is followed by stage 1920 of defining the codebook such as to exclude forbidden combination of values, based on the allowable value of the parameter.

Stage 1920 may include defining (1921) the codebook such as to exclude forbidden combination of values that are expected to cause an expected inter-cell coupling induced error of a magnitude that exceeds the maximal allowable magnitude.

Stage 1920 may include defining (1922) the codebook such as to exclude at least one forbidden combination of values that is expected to cause an expected inter-cell coupling induced error of a magnitude that is lower than the maximal allowable magnitude.

Stage 1920 may include detecting (1924) a set of legitimate combinations of values that are expected to change their value to a forbidden combination of values due to retention; and defining (1925) at least one legitimate combination of values of the set as a forbidden combination of values.

Stage 1920 may include defining (1926) the codebook such as to exclude forbidden combination of values, based on the allowable value of the parameter and differences between values that are expected to be stored in adjacent NVM cells.

Stage 1920 may include defining (1927) the codebook such as to exclude forbidden combination of values, based on the allowable value of the parameter, differences between values that are expected to be stored by adjacent NVM cells and order of programming of the NVM cells.

Method 1900 may also include stage 1930 of defining a desired threshold-voltage range allocation that comprises an uneven gap between at least two pairs of voltage threshold distributions of different program levels.

Stage 1930 may include defining (1932) a desired voltage threshold distribution based on (a) an expected affect of retention on codewords that are stored in the NVM array and (b) values of forbidden combination of values.

Stage 1930 may include defining (1933) the desired voltage distribution such as to increase a probability of (a) a change in a value of a legitimate combination of values stored in the NVM array to a forbidden combination of values, in relation to a probability of (b) a change in value of the legitimate combination of values to another legitimate combination of values.

Stage 1930 may include defining (1934) a gap between a first pair of voltage distributions of a first pair of program levels that is lower than a gap between a second pair of voltage distributions of a second pair of program levels, wherein the first pair of program levels are lower than the second pair of program levels.

Thus, an error correction approach may be provided for constrained inter-cell interference coding. We change the flash read channel by reducing the error rates of higher levels at the cost of increasing the error rates of the lower ones, and add constraints as necessary. The errors of low program levels can be detected at read due to violation of constrained coding restrictions. An iterative decoding algorithm for the correction of such errors was sketched.

Figure 21A:
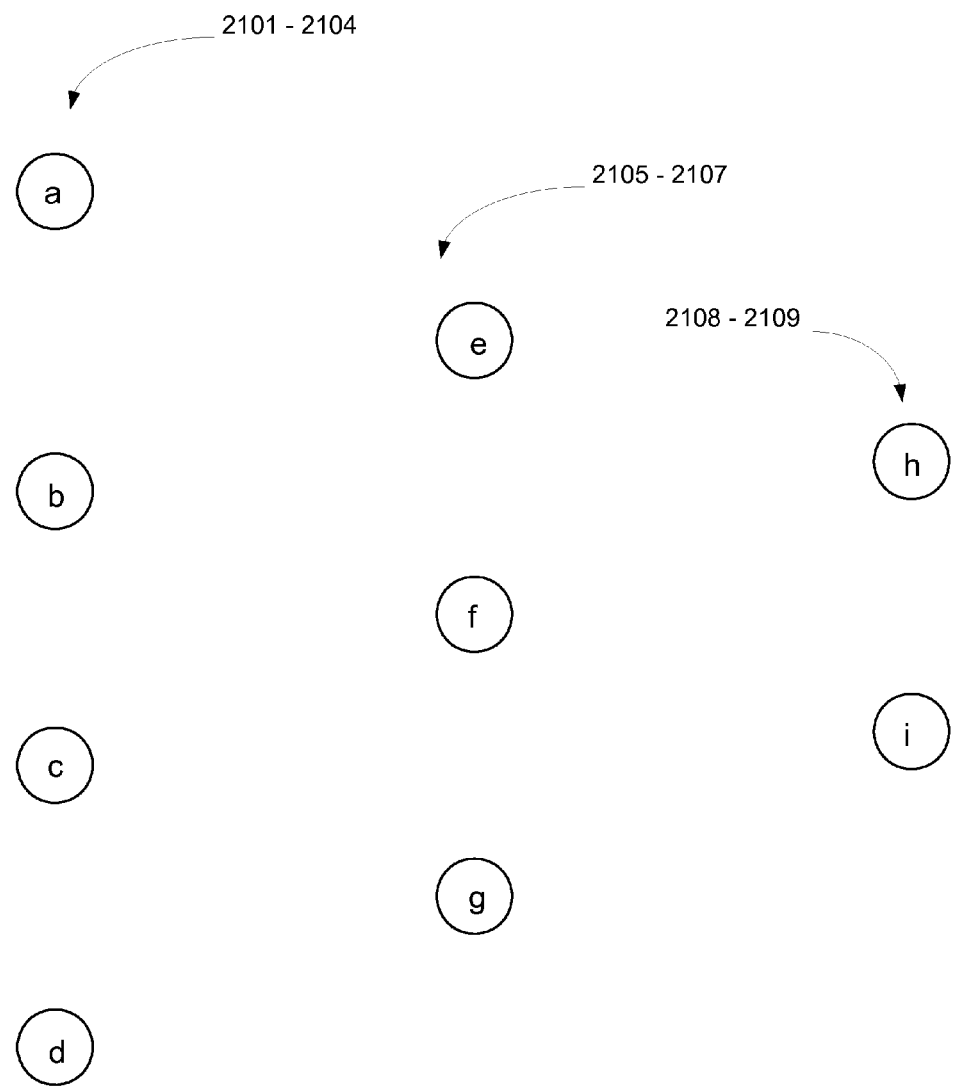

FIG. 21A-21B represent a state machine of a code according to an embodiment of the invention. FIG. 21A illustrates nodes a-i 2101-2109 of the code while FIGS. 21B and 21C illustrate transitions from the nodes (for example "ab" illustrates a transition from node a to node b) as a function of the input (and the current state), as well as the output (denoted iiii/ooooo). For example, referring the leftmost uppermost example of FIG. 21B, node "a" is followed by node "a" with an allocation of inputs/outputs of:

| aa |
|---|
| 0000/00100 |
| 0001/01000 |
| 0010/01100 |
| 0011/00000 |
| 0100/10000 |
| 0101/11000 |
| 0110/11100 |

FIG. 22 illustrates a lookup table 2210 used for encoding, according to an embodiment of the invention. The lookup table represents a rate penalty, e.g. R=5/8=0.625. FIG. 22 also illustrates a corresponding matrix 2220.

It is noted that a code can be constrained to provide a tradeoff between a need of mitigating inter-cell coupling and a need of making leakage errors detectable with higher probability. The tradeoff can be set based upon the ability of correcting errors that are detectible.

It is noted that any information that is encoded in any of the mentioned above manners can be decoded by a constraint decoder and that the decoding process may apply error correction.

Any of the mentioned above methods can be executed by a computer that executed instructions stored in a non-tangible computer readable medium such as but not limited to a disk, a diskette, a storage device, and the like.

Any of the mentioned above methods can be executed by a system. Some of the methods can be executed by a system that includes a code generator, other can be executed by a system that includes a constraint encoder.

Any of the mentioned above systems can have a code generator or may be coupled to a code generator. A code generator can be a computer or any other combination of hardware and software components.

While the invention has been described with respect to a limited number of embodiments, these should not be construed as limitations on the scope of the invention, but rather as examples of some of the embodiments. Those skilled in the art may envision other possible variations, modifications, and implementations that are also within the scope of the invention, based on the disclosure(s) set forth herein.

We claim:

1. A method of operating a non volatile memory (NVM) array that comprises multiple NVM cells, the method comprises: receiving input data to be written to the non volatile memory; performing constraint coding on the input data to provide encoded data; wherein the constraint coding prevents the encoded data from comprising forbidden combinations of values; wherein the forbidden combinations of values are defined based on expected inter-cell coupling induced errors resulting from coupling between NVM cells; and writing the encoded data to the non volatile memory.

2. The method according to claim 1, wherein the performing of the constraint coding comprises preventing the encoded data from comprising forbidden combinations of values based on magnitudes of inter-cell coupling induced errors; wherein a certain NVM cell is read to provide an estimate of a threshold voltage of the certain NVM cell; and wherein a magnitude of an inter-cell coupling induced error associated with a certain NVM cell represents a difference between (a) a desired threshold value of the certain NVM cell-assuming a lack of inter-cell coupling and (b) the estimate of the threshold voltage of the certain NVM cell.

3. The method according to claim 2, wherein the performing of the constraint coding comprises preventing the encoded data from comprising forbidden combination of values that are expected to cause an expected inter-cell coupling induced error of a magnitude that is above a predefined threshold.

4. The method according to claim 3, wherein at least one of forbidden combination of values is expected to cause an inter-cell coupling induced error of a magnitude that is below the predefined threshold.

5. The method according to claim 2, comprising writing the encoded data to the NVM array while maintaining an uneven gap between at least two pairs of voltage threshold distributions of different program levels.

6. The method according to claim 5, wherein a gap between a first pair of voltage distributions of a first pair of program levels is lower than a gap between a second pair of voltage distributions of a second pair of program levels, wherein the first pair of program levels are lower than the second pair of program levels.

7. The method according to claim 1, wherein the forbidden combinations of values correspond to forbidden combination of actual threshold voltages of adjacent NVM cells.

8. The method according to claim 1, comprising: reading the encoded data from the NVM array to provide read data; and performing a constraint decoding of the read data to provide decoded data.

9. The method according to claim 8, comprising detecting forbidden combinations of values in the read data and converting the forbidden combination of values to allowed combination of values.

10. The method according to claim 9, wherein the converting is responsive to an expected effect of retention on the encoded data.

11. A system, comprising: a constraint encoder, arranged to: receive input data to be written to a non volatile memory; and perform constraint coding on the input data to provide encoded data; wherein the constraint coding prevents the encoded data from comprising forbidden combinations of values ; wherein the forbidden combinations of values are defined based on expected inter-cell coupling induced errors resulting from coupling between non volatile memory (NVM) cells of an NVM array; and a write circuit arranged to write the encoded data to the non volatile memory.

12. The system according to claim 11, wherein the system is arranged to prevent the encoded data from comprising forbidden combinations of values based on magnitudes of inter-cell coupling induced errors; wherein a certain NVM cell is read to provide an estimate of a threshold voltage of the certain NVM cell; and wherein a magnitude of an inter-cell coupling induced error associated with a certain NVM cell represents a difference between (a) a desired threshold value of the certain NVM cell—assuming a lack of inter-cell coupling and (b) the estimate of the threshold voltage of the certain NVM cell.

13. The system according to claim 12, wherein the system is arranged to prevent the encoded data from comprising forbidden combination of values that are expected to cause an expected inter-cell coupling induced error of a magnitude that is above a predefined threshold.

14. The system according to claim 13, wherein at least one of forbidden combination of values is expected to cause an inter-cell coupling induced error of a magnitude that is below the predefined threshold.

15. The system according to claim 12, wherein the system is arranged to write the encoded data to the NVM array while maintaining an uneven gap between at least two pairs of voltage threshold distributions of different program levels.

16. The system according to claim 15, wherein a gap between a first pair of voltage distributions of a first pair of program levels is lower than a gap between a second pair of voltage distributions of a second pair of program levels, wherein the first pair of program levels are lower than the second pair of program levels.

17. The system according to claim 11, wherein the forbidden combinations of values correspond to forbidden combination of actual threshold voltages of adjacent NVM cells.

18. The system according to claim 11, wherein the system is arranged to read the encoded data from the NVM array to provide read data; and performing a constraint decoding of the read data to provide decoded data.

19. The system according to claim 18, wherein the system is arranged to detect forbidden combinations of values in the read data and convert the forbidden combination of values to allowed combination of values.

20. The system according to claim 19, wherein the system is arranged to convert is response to an expected effect of retention on the encoded data.

21. A non transitory computer readable medium that stores instructions for: receiving input data to be written to a non volatile memory; performing constraint coding on the input data to provide encoded data; wherein the constraint coding prevents the encoded data from comprising forbidden combinations of values; wherein the forbidden combinations of values are defined based on expected inter-cell coupling induced errors resulting from coupling between non volatile memory (NVM) cells of an NVM array; and writing the encoded data to the non volatile memory.

22. The non transitory computer readable medium according to claim 21 wherein a gap between a first pair of voltage distributions of a first pair of program levels is lower than a gap between a second pair of voltage distributions of a second pair of program levels, wherein the first pair of program levels are lower than the second pair of program levels.

23. The non transitory computer readable medium according to claim 21, wherein the forbidden combinations of values correspond to forbidden combination of actual threshold voltages of adjacent NVM cells.

24. The non transitory computer readable medium according to claim 21, further storing instructions for reading the encoded data from the NVM array to provide read data; and performing a constraint decoding of the read data to provide decoded data.

25. The non transitory computer readable medium according to claim 24, further storing instructions for detecting forbidden combinations of values in the read data and converting the forbidden combination of values to allowed combination of values.

26. The non transitory computer readable medium according to claim 25, wherein the converting is responsive to an expected effect of retention on the encoded data.

27. A non transitory computer readable medium that stored instructions for providing a codebook of a constraint code, wherein the instructions comprise: receiving an allowable value of a parameter of an inter-cell coupling induced error, the inter-cell coupling induced error results from coupling between non-volatile memory (NVM) cells; and defining the codebook such as to exclude forbidden combination of values, based on the allowable value of the parameter.

28. The non transitory computer readable medium according to claim 27, wherein the allowable value of the parameter is a maximal allowable magnitude of an inter-cell coupling induced error; wherein a certain NVM cell is read to provide an estimate of a threshold voltage of the certain NVM cell; and wherein a magnitude of an inter-cell coupling induced error associated with a certain NVM cell represents a difference between (a) a desired threshold value of the certain NVM cell—assuming a lack of inter-cell coupling and (b) the estimate of the threshold voltage of the certain NVM cell.

29. The non transitory computer readable medium according to claim 28, further storing instructions for defining the codebook such as to exclude forbidden combinations of values that are expected to cause an expected inter-cell coupling induced error of a magnitude that exceeds the maximal allowable magnitude.

30. The non transitory computer readable medium according to claim 28, further storing instructions for defining the codebook such as to exclude at least one forbidden combination of values that is expected to cause an expected inter-cell coupling induced error of a magnitude that is lower than the maximal allowable magnitude.

31. The non transitory computer readable medium according to claim 28, further storing instructions for defining a desired threshold-voltage range allocation that comprises an uneven gap between at least two pairs of voltage threshold distributions of different program levels.

32. The non transitory computer readable medium according to claim 31, further storing instructions for defining a gap between a first pair of voltage distributions of a first pair of program levels that is lower than a gap between a second pair of voltage distributions of a second pair of program levels, wherein the first pair of program levels is lower than the second pair of program levels.

33. The non transitory computer readable medium according to claim 31, wherein the forbidden combinations of values correspond to forbidden combination of actual threshold voltages of adjacent NVM cells.

34. The non transitory computer readable medium according to claim 28, further storing instructions for defining a desired voltage threshold distribution based on (a) an expected affect of retention on codewords that are stored in the NVM array and (b) forbidden combination of values.

35. The non transitory computer readable medium according to claim 28, further storing instructions for defining the desired threshold-voltage range allocation among levels such as to increase a probability of (a) a change in a value of a legitimate combination of values stored in the NVM array to a forbidden combination of values, in relation to a probability of (b) a change in value of the legitimate combination of values to another legitimate combination of values.

36. The non transitory computer readable medium according to claim 28, further storing instructions for detecting a set of legitimate combinations of values that are expected to change their value to a forbidden combination of values due to retention; and defining at least one legitimate combination of values of the set as a forbidden combination of values.

37. The non transitory computer readable medium according to claim 27, further storing instructions for determining the allowable value of the parameter of the inter-cell coupling induced error.

38. The non transitory computer readable medium according to claim 37, wherein the determining is responsive to an order of writing data to the NVM cells.

39. The non transitory computer readable medium according to claim 37, wherein the order is selected from a group consisting of left-to-right programming, breadth first programming and open loop programming.

40. The non transitory computer readable medium according to claim 27, further storing instructions for defining the codebook such as to exclude forbidden combination of values, based on the allowable value of the parameter and differences between values that are expected to be stored by adjacent NVM cells.

41. The non transitory computer readable medium according to claim 27, further storing instructions for defining the codebook such as to exclude forbidden combination of values, based on the allowable value of the parameter, differences between values that are expected be stored by adjacent NVM cells and order of programming of the NVM cells.

* * * * *